(12) United States Patent
Basker et al.

(10) Patent No.: US 7,863,189 B2
(45) Date of Patent: Jan. 4, 2011

(54) METHODS FOR FABRICATING SILICON CARRIERS WITH CONDUCTIVE THROUGH-VIAS WITH LOW STRESS AND LOW DEFECT DENSITY

(75) Inventors: Veeraraghaven S. Basker, Albany, NY (US); John Michael Cotte, New Fairfield, CT (US); Hariklia Deligianni, Tenafly, NJ (US); John Ulrich Knickerbocker, Monroe, NY (US); Keith T. Kwietniak, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1033 days.

(21) Appl. No.: 11/620,423

(22) Filed: Jan. 5, 2007

(65) Prior Publication Data

US 2008/0164573 A1    Jul. 10, 2008

(51) Int. Cl.
*H01L 21/44* (2006.01)

(52) U.S. Cl. ............... 438/667; 438/639; 257/621; 257/E21.585

(58) Field of Classification Search ............... 257/621, 257/E21.585; 438/667, 639
See application file for complete search history.

(56) References Cited

U.S. PATENT DOCUMENTS

| | | |
|---|---|---|
| 3,787,252 A | 1/1974 | Filippazzi et al. |
| 4,939,568 A | 7/1990 | Kato et al. |
| 5,024,966 A | 6/1991 | Dietrich et al. |
| 5,039,628 A | 8/1991 | Carey |
| 5,198,888 A | 3/1993 | Sugano |
| 5,391,917 A | 2/1995 | Gilmour |
| 5,506,755 A | 4/1996 | Miyagi |
| 5,608,262 A | 3/1997 | Degani et al. |
| 5,618,752 A | 4/1997 | Gaul |
| 5,646,067 A | 7/1997 | Gaul |
| 5,646,828 A | 7/1997 | Degani et al. |
| 5,654,590 A | 8/1997 | Kuramochi |
| 5,656,856 A | 8/1997 | Kweon |
| 5,717,245 A | 2/1998 | Pedder |
| 5,763,947 A | 6/1998 | Bartley |
| 5,854,534 A | 12/1998 | Beilin et al. |
| 5,869,894 A | 2/1999 | Degani et al. |
| 5,910,685 A | 6/1999 | Watanabe et al. |
| 5,942,795 A | 8/1999 | Hoang |
| 5,953,213 A | 9/1999 | Napierala |
| 5,990,550 A | 11/1999 | Umezawa |
| 5,998,292 A | 12/1999 | Black et al. |
| 6,002,178 A | 12/1999 | Lin |
| 6,006,428 A | 12/1999 | Feilchenfeld et al. |
| 6,013,948 A | 1/2000 | Akram et al. |
| 6,034,427 A | 3/2000 | Lan et al. |
| 6,046,499 A | 4/2000 | Yano et al. |
| 6,049,465 A | 4/2000 | Blish, II et al. |
| 6,052,287 A | 4/2000 | Palmer et al. |
| 6,064,113 A | 5/2000 | Kirkman |

(Continued)

*Primary Examiner*—W. David Coleman
*Assistant Examiner*—Christine Enad

(57) ABSTRACT

Methods are provided for fabricating silicon carriers with conductive through-vias that allow high-yield manufacture of silicon carrier with low defect density. In particular, methods are provided which enable fabrication of silicon carries with via diameters such as 1 to 10 microns in diameter for a vertical thickness of less than 10 micrometers to greater than 300 micrometers, which are capable robust to thermal-mechanical stresses during production to significantly minimize the thermal mechanical movement at the via sidewall interface between the silicon, insulator, liner and conductor materials.

10 Claims, 31 Drawing Sheets

U.S. PATENT DOCUMENTS

| | | |
|---|---|---|
| 6,081,026 A | 6/2000 | Wang et al. |
| 6,221,769 B1 | 4/2001 | Dhong et al. |
| 6,268,660 B1 | 7/2001 | Dhong et al. |
| 6,284,653 B1 | 9/2001 | Tseng |
| 6,856,023 B2 | 2/2005 | Muta et al. |
| 6,908,856 B2 * | 6/2005 | Beyne et al. ............... 438/667 |
| 2007/0197013 A1 * | 8/2007 | Trezza ....................... 438/597 |

* cited by examiner

METHODS FOR FABRICATING SILICON CARRIERS WITH CONDUCTIVE THROUGH-VIAS WITH LOW STRESS AND LOW DEFECT DENSITY

GOVERNMENT LICENSE RIGHTS

This invention was made with Government support under Contract No. NBCH3039004 awarded by the Defense Advanced Research Projects Agency (DARPA) and H98230-04-C-0920 awarded by the Maryland Procurement Office. The Government has certain, rights in this invention.

TECHNICAL FIELD OF THE INVENTION

The present invention generally relates to silicon carrier structures for high-density packaging of multiple integrated circuit chips. More specifically, the present invention relates to methods for fabricating silicon carriers with high-aspect ratio conductive through-vias having robust structures capable of withstanding thermal-mechanical stresses encountered during fabrication, thereby allowing high-yield manufacture of silicon carriers with low stress and low defect density.

BACKGROUND

Advances in semiconductor chip fabrication and packaging technologies have enabled the development of highly integrated semiconductor chips and compact chip package structures or electronic modules. For example, silicon integrated circuit chips can be fabricated with high integration density and functionality to form what is referred to as SoC (System on Chip). With SoC designs, the functionality of a complete system (e.g., computer) is integrated on a single silicon die. SoC solutions may not be practical or achievable for chip-level integration when a given system design requires the use of heterogeneous semiconductor technologies to fabricate the necessary system integrated circuits.

In this regard, SIP (System In a Package) or SOP (System On a Package) techniques are used to integrate various die technologies (e.g., Si, GaAs, SiGe, SOI) to form a complete system which approximates SoC performance. By way of example, a SOP module can be constructed by mounting a plurality of semiconductor chips to a chip carrier substrate having conductive through-vias (and other conductive wiring) which provide I/O and power interconnects between IC chips on the top-side of the carrier and I/O contacts on a next level packaging structure coupled to the bottom-side of the carrier. Depending on the application, SOP modules can foe constructed using ceramic, organic, or semiconductor carrier structures.

Conventional packaging solutions have been based primarily on organic and ceramic carrier technologies. There are disadvantages associated with organic and ceramic carrier technologies including, for example, high fabrication costs and inherent limitations the practical integration, density, I/O density, power density, etc, that may be achieved using organic or ceramic carriers, as is known in the art. It is believed that inherent limitations and high fabrication costs associated with ceramic and organic carrier technologies may limit the ability or desire to use such carrier technologies to meet the increasing demands for higher density and higher performance packaging solutions.

On the other hand, there has been increasing focus on the use of silicon carrier technologies to support the next generation packaging solutions. Indeed, state of the art silicon manufacturing techniques which follow CMOS back-end-of line design rules can be employed for low-cost fabrication of silicon carriers having high density wiring and through-via interconnects, sufficient to support enabling low-cost and high-density I/O SOP packaging solutions. One significant advantage in using silicon carrier packages for high density packaging of silicon chips, for example, is that both carrier and chip have the same or similar CTE (coefficient of thermal expansion). In this regard, during thermal cycling, the expansion and contraction between the silicon carrier packages and silicon chips is matched, thereby minimizing the stresses and strains that may be generated in the contacts (e.g., solder balls) between chip and substrate, thereby allowing high-density micro bump interconnections to scale to smaller sizes.

Despite the increasing focus in the microelectronics industry on the use of silicon carrier substrates for packaging designs, fabrication of silicon carriers with conductive through-vias for high-performance applications is not trivial. In general, silicon carriers with thru wafer via interconnects are fabricated using various techniques that generally include processing steps such as forming via holes in silicon substrates by mechanical drilling or using damascene type process flows including patterning and then wet etching or dry etching, depositing liner/seed layers on the via hole sidewalls, via metallization to fill the via holes with a metallic material (deposition or electroplating), and chemical mechanical polishing (CMP).

The ability to fabricate silicon carriers with high yield and low defect density can be problematic using conventional methods depending on, e.g., the size and geometry of the target vias (aspect ratio, width, pitch), the types of materials and/or processes used to line and fill the via holes, and the order of the processing steps, etc. For example, due to the CTE mismatch between the silicon substrate and the liner/insulation and metallic materials (e.g., copper, tungsten) used to fill the vias, substantial stresses and strains may be generated at the via sidewalls clue to differences in thermal expansion and contraction during carrier substrate production and via processing, which can result in interfacial delamination at the via sidewalls and/or cracking or fracturing of the silicon substrate. These thermal-mechanical defects can occur, for example, when forming via diameters of 1~10 microns for vertical thickness of less than 10 microns. Therefore, differential thermal expansion of the materials forming the through-via structures and the substrate material during via manufacturing is a critical design issue.

Moreover, the ability to form high aspect ratio through-vias (e.g., copper through-vias with aspect rations of greater than 30 to 1) is challenging to form defect free vias due to common problems such as pinch off and/or process chemical entrapment in the resulting via structure (e.g., entrapment of electrolyte during electroplating), etc Some conventional methods include vias that are fabricated by forming a closed end vertical hole lined with insulation and filled with a conductive inner core, followed by thinning and removal of the underlying substrate material and dielectric insulator at the bottom of the vias to open electrical contact to the conductor. Defect free filling of the closed end vias and control and uniformity later thinning the wafer to open is dependent on targeted feature sizes and process tolerance control. Therefore, depending on the desired structure (via diameter, height), wafer processing and tolerance controls, the impact on manufacturing yield can be significant.

SUMMARY OF THE INVENTION

Exemplary embodiments of the invention generally includes to methods for fabricating silicon carrier structures with conductive through-via structures, which allow for high-density packaging of multiple integrated circuit chips. More specifically, exemplary embodiments of the invention include methods for fabricating silicon carriers with high-aspect ratio conductive through-vias using thru-mask plating, chemical vapor deposition (CVD), physical vapor deposition (PVF) and/or atomic layer deposition (ALD) methods to fabricate deep thru via structures having robust structures capable of withstanding thermal-mechanical stresses encountered during fabrication, thereby allowing high-yield manufacture of silicon carriers with low stress and low defect density.

In one exemplary embodiment of the invention, a method for fabricating a conductive via structure in a semiconductor substrate includes forming a via hole in a semiconductor substrate, wherein the via hole comprises an open end on a first surface of the semiconductor substrate, an interior sidewall surface having an insulating layer formed thereon, and a closed end having a first conductive material providing a seed layer formed on a surface of the closed end of the via hole. An electroplating process is performed to fill the via hole with a second conductive material to form a conductive via using an electroplating process wherein plating current is forced to flow only through the surface of the closed end of the via hole so that plating starts from the seed layer on the surface of the closed end of the via hole and progresses towards the open end of the via hole. Electrical contacts are formed to each end of the conductive via.

In one exemplary embodiment of the invention, the conductive via is a through-via structure that extends between the first surface and second surface of the substrate, wherein a width or diameter of the through-via structure is about 0.5 microns to about 10 microns and wherein a height of the through-via structure is less than about 10 microns. In another embodiment, the width or diameter of the through-via structure is about 0.5 microns to about 10 microns and the height of the through-via structure is about 300 microns or greater.

In one exemplary embodiment of the invention, the via hole if formed by etching an annular trench in the first surface of the semiconductor substrate to a depth d below the first surface of the substrate, which is less than a thickness of the substrate defined by the first surface and a second surface of the substrate opposite the first surface, wherein the annular trench surrounds an inner core of substrate material, forming a first insulating layer to fill the annular trench and cover the first surface of the substrate with first insulating material, patterning the first insulation layer formed on the first surface of the substrate to expose the inner core of substrate material, and etching the inner core of substrate material down to the depth d below the first surface of the substrate to form the via hole, wherein the insulation layer on the sidewall surface is formed by the first insulation material, and wherein a surface of the closed end of the via hole is defined by substrate material.

The via hole is then filled by forming an electrical contact on the second surface of the semiconductor substrate opposite the first surface, and performing the electroplating process by applying the plating current to the electrical contact to fill the via hole with a copper material, wherein the first insulating layer impedes plating current from flowing from the substrate through the first surface of the substrate and sidewalls of the substrate.

In another exemplary embodiment, the via hole is filled by etching a closed end via hole in the first surface of the semiconductor substrate to a depth d below the first surface of the substrate, which is less than a thickness of the substrate defined by the first surface and a second surface of the substrate opposite the first surface, forming a first insulating layer to cover the first surface of the substrate and sidewall and closed end surfaces of the via hole with first insulation material, bonding a carrier substrate to the first surface of the semiconductor substrate closing an open end of the via hole, recessing the second surface of the semiconductor substrate down to the closed end of the via hole to open the via hole on the recessed second surface, and forming a conformal conductive liner over the recessed second surface of the semiconductor substrate to line the insulation layer and a second closed end surface of the via hole defined by the surface of the carrier substrate material, wherein the conductive liner comprises the first conductive material serving as the seed layer.

The via hole is then filled by forming an electrical contact on a surface of the carrier substrate opposite a first surface of the carrier substrate bonded to the semiconductor substrate, and performing the electroplating process by applying the plating current to the electrical contact to fill the via hole with a copper material starting at the seed layer, wherein the first insulating layer impedes plating current from flowing from the carrier substrate through the semiconductor substrate and the sidewalls of the via hole in the substrate.

In yet another exemplary embodiment, the via hole is formed by forming a first insulating layer over the first surface of the semiconductor substrate, etching the first insulating layer and semiconductor substrate to form a closed end via hole in the first surface of the semiconductor substrate to a depth d below the first surface of the substrate, which is less than a thickness of the substrate defined by the first surface and a second surface of the substrate opposite the first surface, forming a second insulating layer to cover the first surface of the substrate and sidewall and closed end surfaces of the via hole with second insulation material, performing an anisotropic etch to remove the second insulation material from the closed end surface of the via hole, and forming a conformal conductive liner over the first surface of the semiconductor substrate to line the first insulation layer on the via sidewall and to line the closed end surface of the via hole with a first conductive material serving as the seed layer on the closed end of the via hole.

The via hole is then filled by forming an electrical contact on the second surface of the semiconductor substrate opposite the first surface and performing the electroplating process by applying the plating current to the electrical contact to fill the via hole with a copper material starting from the seed layer at the closed end, wherein the first and second insulating layers impede plating current from flowing from the substrate through the first surface of the substrate and sidewalls of the substrate, respectively.

In yet another exemplary embodiment of the invention, the via hole is formed by etching a closed end via hole in the first surface of the semiconductor substrate to a depth d below the first surface of the substrate, which is less than a thickness of the substrate defined by the first surface and a second surface of the substrate opposite the first surface, forming a first insulating layer to cover the first surface of the substrate and sidewall and closed end surfaces of the via hole with first insulation material, forming a conformal conductive liner over the first surface of the substrate to line the insulation layer and a second closed end surface of the via hole, filling the via hole with a sacrificial material, planarizing the first surface of the substrate down to the conductive liner layer on the first surface of the substrate, forming a layer of second conductive material over the planarized surface, bonding a carrier substrate to the second conductive material on the first surface of the semiconductor substrate, depositing a layer of third conductive material over the carrier substrate in electrical contact with the layer of second conductive material, recessing the second surface of the semiconductor substrate down to the closed end of the via hole to open the via hole on the recessed second surface and removing the sacrificial material in the via hole.

The via hole is then filled by performing the electroplating process by applying the plating current to the layer of third conductive material to fill the via hole with a copper material starting at a seed layer at a closed end of the via hole defined by a portion of the layer of second conductive material exposed by the via hole, wherein the first insulating layer impedes plating current from flowing from the carrier substrate through the semiconductor substrate and the sidewalls of the via hole in the substrate.

In another embodiment of the invention, a semiconductor device includes a silicon carrier substrate comprising a planar bulk substrate having a thickness t between first and second surfaces of the bulk semiconductor substrate, and an array of conductive through-vias formed through the bulk semiconductor substrate between the first and second surfaces of the bulk substrate. The conductive through-vias have inner conductor cores that are seam-free. In one embodiment, the conductive through-vias have aspect ratios (via height to diameter) of less than about 8:1 where the conductive through-via structures have a width or diameter of about 0.5 microns to about 10 microns and a height of about 10 microns or less. In another embodiment, the conductive through-vias have aspect ratios of about 30:1 or greater where the conductive through-via structures have a width or diameter of about 0.5 microns to about 10 microns and a height of about 300 microns or greater. The conductive through-vias are formed by a barrier layer and an adhesion layer lining a via hole formed through the bulk substrate and an inner core filled with a conductive material.

In other embodiments, the silicon carriers include interconnection structure comprising one or more layers of metallization formed on the first surface of the bulk substrate electrically coupled to first end portions of the conductive through-via, and a plurality of electrical contacts formed on second end portions of the conductive through-vias on the second surface of the bulk substrate. One or more integrated circuit chips are mechanically and electrically coupled to the interconnection structure.

These and other exemplary embodiments, aspects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1A:
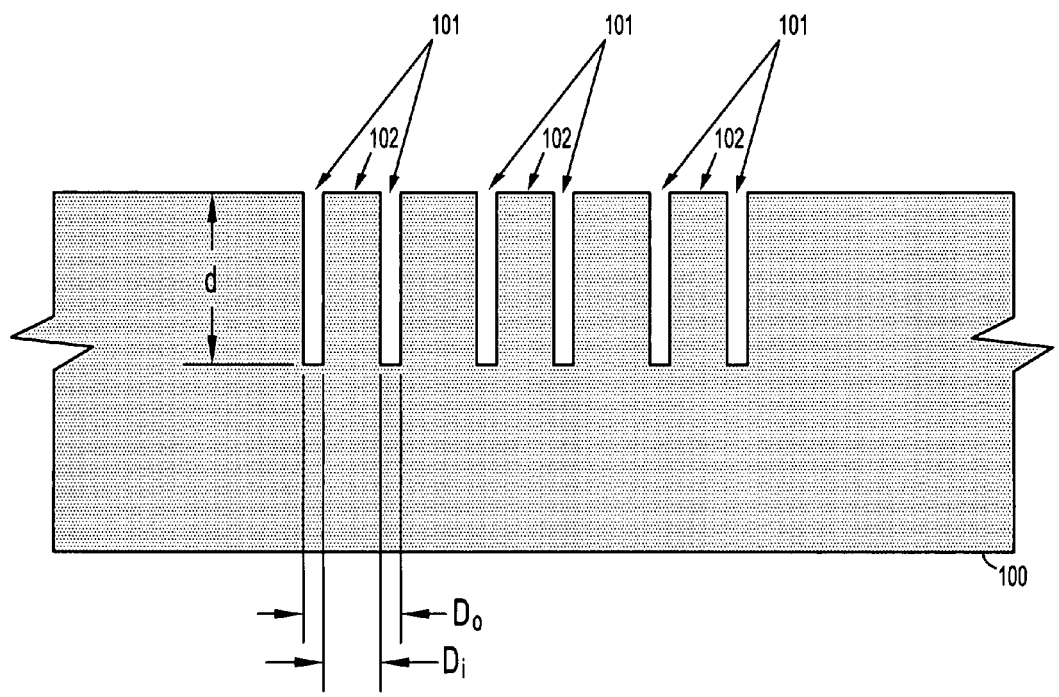
FIGS. 1A~1J schematically illustrate a method for fabricating a silicon carrier with through-via interconnects according to an exemplary embodiment of the invention.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 7:
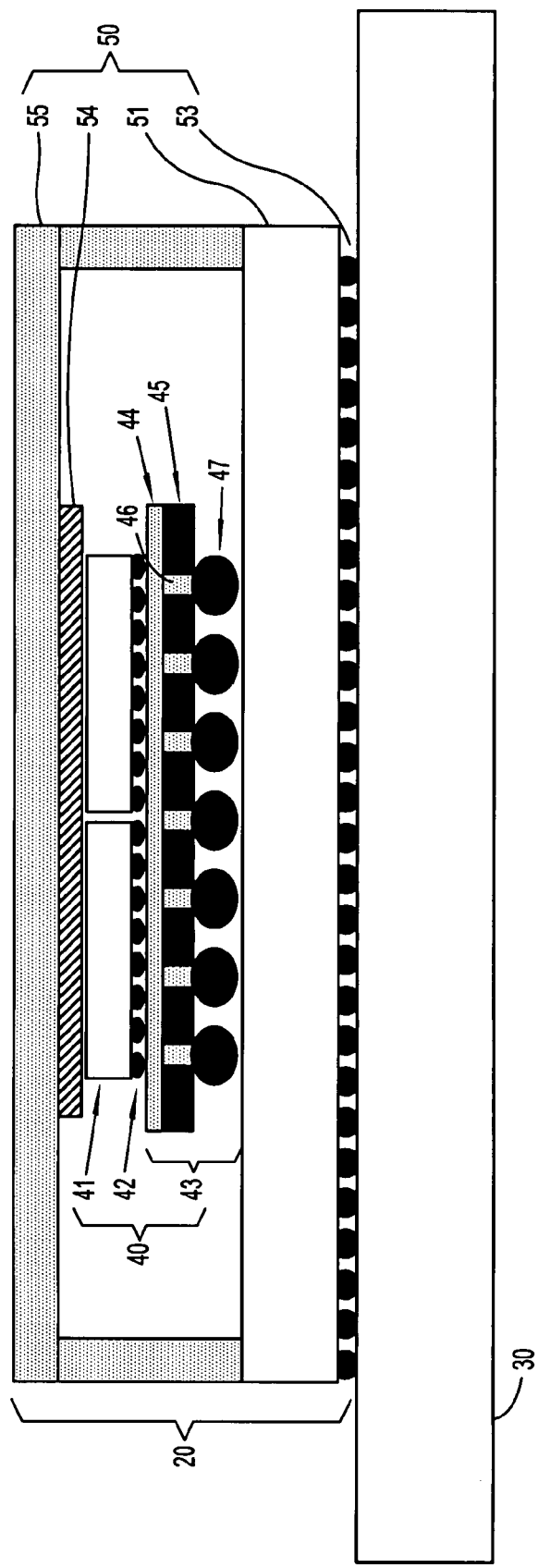
FIG. 7 is a schematic side-view of a chip package that is constructed using a silicon carrier with through-via interconnects according to another exemplary embodiment of the invention.

FIG. 7 is a schematic side-view of an electronic package (10) having a silicon carrier with conductive through-vias fabricated using one of various exemplary methods described herein. The electronic package (10) generally comprises an SOP (system on package) module (20) electrically and mechanically mounted to an electric circuit board (30). The SOP module (20) generally comprises a chip-level package (40) and a system level package (50). The chip-level package (40) comprises a plurality of silicon IC chips (41) flip-chip mounted to a silicon carrier (43) using a high density array of micro C4s (42).

The silicon carrier (43) comprises a multilayer metallization structure (44) formed on the top surface of a silicon substrate (45) comprises a silicon substrate (45), a plurality of conductive through-vias (45) exposed on top and bottom surfaces of the substrate (45), and an array of solder balls (e.g., C4s). The metallization (44) and conductive through-vias (46) provide space transforming interconnections between the top-side chip contacts (42) and the bottom-side I/O contacts (47) of the silicon carrier (43).

The system-level package (50) comprises an organic or ceramic substrate (51), for example, on which the chip-level package (40) is mounted. The substrate (51) includes multiple levels of wiring and interconnects that provide space transformation interconnections between the contact array (47) on the top-side of the substrate (51) and the contact array (53) on the bottom-side of the substrate (51). The system-level package (50) further comprises a thermal hat or neat spreader (54) and package lid (55). The thermal hat (54) is thermally coupled between the backside of the chips (41) and the package lid (55) using, e.g., a thermal conductive and mechanically compliant paste, to remove heat from the chips. The package lid (55) may be formed of metallic material (copper, aluminum) which draws heat from the thermal cap (54). A heat sink can be mounted to the top of the package lid (55) to enable high performance cooling.

Various methods for fabricating silicon carriers (such as the silicon carrier (43) of FIG. 7) will now be discussed in further detail below. Exemplary methods enable fabrication of defect free conductive through-vias for low thickness vertical interconnections, having minimal cross sectional area of vertical conductor and deep high aspect ratio of via diameter to height made in form factors which support very thick vertical connections, and support thermo-mechanical and process stresses which can be due to CTE mismatch in conductor and substrate. Exemplary methods allow fabrication of small conductors with aspect ratios (height to diameter) of less than 3 to 1 and over 30 to 1 with low defect density.

In particular, exemplary fabrication techniques described in further detail herein below enable fabrication of silicon carriers with through-via conductors having conductor widths/diameters in a range of about 0.5 microns to about 10 microns for a vertical thicknesses less than 10 microns or greater than 300 microns, which are capable of significantly minimizing thermal/mechanical movement at the sidewall interfaces between the silicon, insulator, liner and conductor materials of the through-via conductor structures.

Moreover, exemplary embodiments of the invention allow for fabrication of through-via conductors in the form of wire columns, annular columns, square wires, rectangular wires, multiple wires such as columns, double annular, multiple squares, multiple rectangular wires, slots or bar shapes with independent or combined electrical connections on the top and/or bottoms of the silicon through-vias. Through-via conductor structures may be formed to serve various purposes, such signal I/O interconnections, ground or voltage connectors, coaxial connections, or electrical shields.

FIGS. 1A~1J schematically illustrate a method for fabricating a silicon carrier with through-via interconnects according to an exemplary embodiment of the invention. In general, FIGS. 1A~1J illustrate a method in which silicon through-vias (closed-end vias) are first formed in a silicon wafer, followed by formation of BEOL (backend of line) wiring levels to form connections to the open-ends of the vias, and then wafer thinning to expose the close-end of the vias and form bottom, side interconnects. In the exemplary embodiment, via holes are filled with copper metallization using a bottom-up fill electroplating process that completely fills the vias without producing voids or trapping trace electrolyte. As will be explained below, thru-mask plating is achieved by differentiating between the top surface of the wafer, as well as the sidewall and base of the features being plated such that current flow is impeded to the top surface and sidewall of the via features being plated thereby forcing current to flow only through the bottom, of the via holes having a conductive material on which nucleation can occur during plating With this method, freestanding silicon carriers can be fabricated in the thickness range of 200-300 microns with deep through-vias with high aspect ratios.

More specifically, FIG. 1A illustrates initial steps in the exemplary process where a semiconductor wafer (100) is etched to form a plurality of annular trenches (101) (or collar features) to a depth d below a front side surface of the wafer (100). Each annular trench (101) surrounds (encircles) an inner core (or post) (102) of substrate material, and formed having an outer diameter, Do representing the diameter of the resulting carrier through-vias, and an inner diameter Di representing the diameter of an inner core (102). The wafer (100) may be formed of a semiconductor material such, as Si, Ge, GaAS GaP, InAs, InP, etc, which is suitable for a given application. In one exemplary embodiment of the invention, the wafer (100) is formed of silicon that is backside doped with n-type dopants (e.g., As). The annular trenches (101) can be formed using conventional methods including forming an etch mask on the surface of the wafer (100) and etching the wafer (100) using any suitable anisotropic dry or wet etching process. In one exemplary embodiment, a Bosch-type deep RIE is utilized as such etching method includes alternating deposition and passivation steps that allow formation of through-vias with smooth, straight sidewalls to depths of 300 μm, as is known in the art.

Figure 1B:
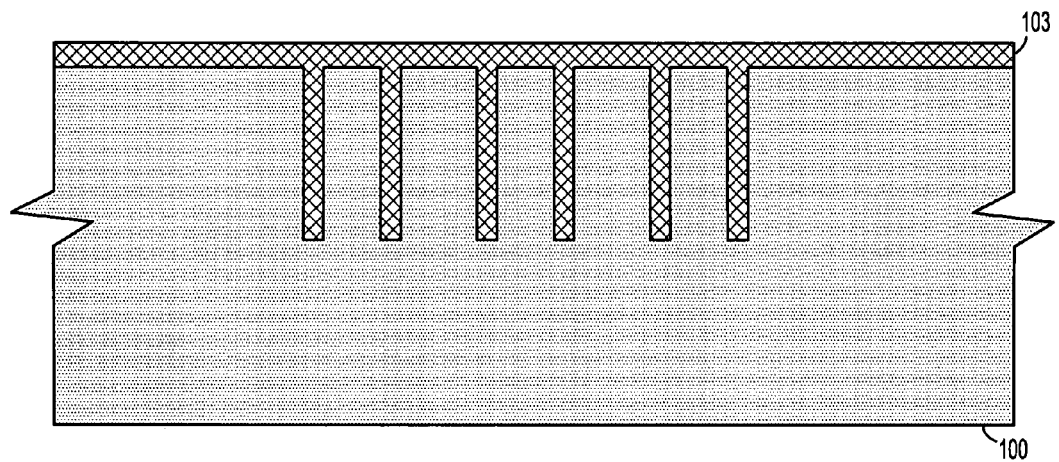

Following the etching of the annular trenches (101), a layer of dielectric material (103) is formed to cover the surface of the wafer (100) and to backfill the annular trenches (101), such as depicted in FIG. 1B. The dielectric layer (103) may be formed of one or more insulator materials such as an oxide and or nitride. For example, the dielectric layer (103) may be an oxide that is grown or deposited using known techniques, such as, thermal oxidation, CVD (chemical vapor deposition), or a nitride that is formed by CVD, etc. In another embodiment, the layer of dielectric (103) may be formed of a thermal oxide with added filler material such as poly-Si other material so that the dielectric layer (103) provides sufficient insulation characteristics while forming a controlled stress insulator layer having a CIS that is more closely matched to that of the silicon material of the substrate (100). The dielectric filled annular rings provide electrical insulation between the silicon and inner conductive cores of the vias that are subsequently formed.

Figure 1C:
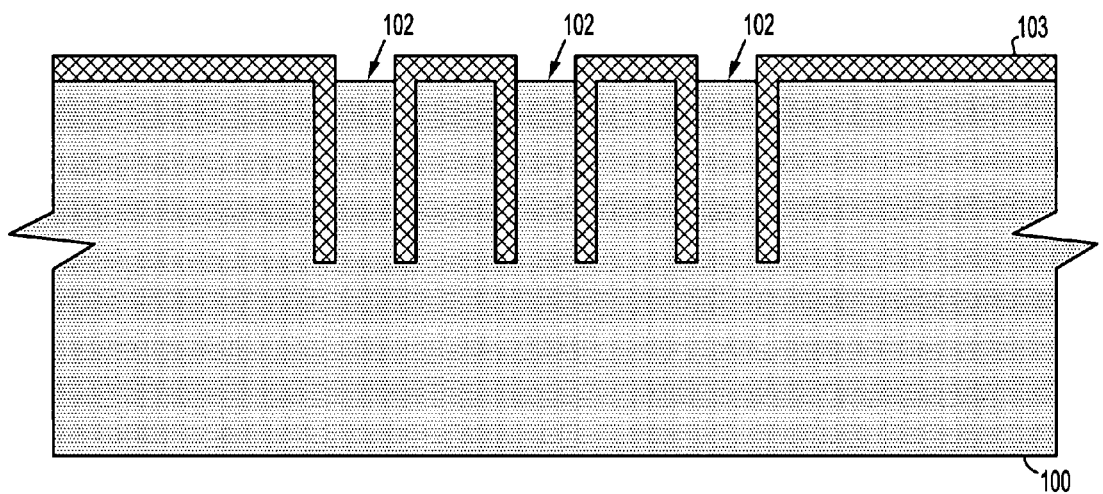

After formation of the dielectric layer (103), an etch mask is formed over the dielectric layer (103) having openings to expose the portions of the dielectric layer (103) aligned to the inner core features (102). As depicted in FIG. 1C, the dielectric layer (103) is etched to expose the surface of the inner core elements (102). In one exemplary method, the etching is performed using a dry etch process with an etch chemistry that is suitable for etching the types of material(s) forming the dielectric film (103).

Figure 1D:
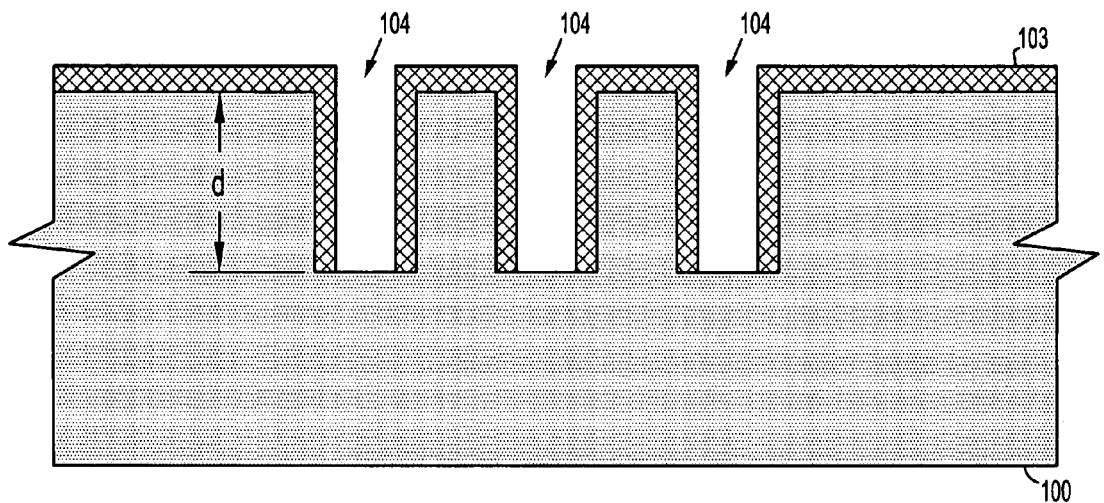

Referring to FIG. 1D, a deep Si etch process is performed to etch away the inner core elements (102) to the depth, d, below the surface of the wafer (100) to form via holes (104) having sidewall surfaces that are defined by an annular ring of the dielectric film (103). The deep Si etch process can be performed using the dielectric layer (103) as an etch mask and using an etch chemistry that is highly selective to etching the silicon material of the exposed inner core elements (102).

Figure 1E:
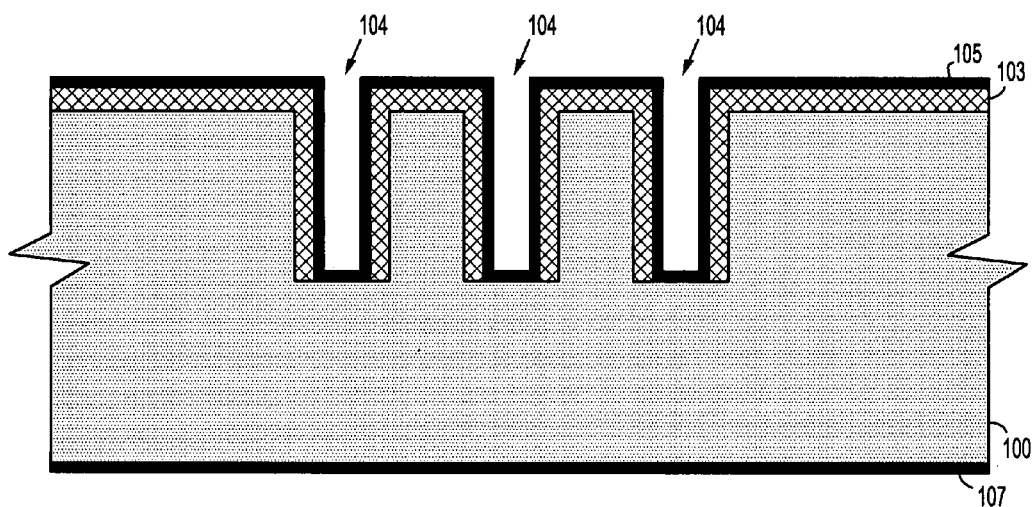

Referring to FIG. 1E, a barrier/adhesion layer (105) (or liner layer) is formed to line the exposed insulated sidewall and bottom surfaces of the via holes (104). The liner layer (105) may be deposited in one layer or stacked layers. For instance, a first layer may be deposited providing a barrier layer which prevents migration of material into the substrate. A second layer may be an adhesion layer formed on the barrier layer to that forms good adhesion to both the barrier metal and to a third metal (e.g., copper) that fills the via holes. In particular, the liner layer (105) may be formed by depositing one or more conformal layers of TaN, Ta, Ru, Ti, and/or TiN using PVD, CVD, ALB, etc. A single layer of TiN functions as both a barrier metal and adhesion layer. If a barrier metal other than TiN is utilized, an adhesion layer may be deposited including adhesion metals such as chromium, titanium or titanium tungsten. The adhesion layer is deposited using sputtering or evaporation. In one exemplary embodiment, the barrier and adhesion metal layers are preferably (but not limited to) deposited to a thickness of about 10 angstroms to about 200 angstroms. For example, in one preferred exemplary embodiment, the barrier layer may be a layer of TaN deposited with a thickness in the range of about 10 angstroms to about 200 angstroms (preferably, 20 angstroms) or a layer of Ta deposited with a thickness in the range of about 10 to about 200 angstroms (preferably, 50 angstroms), and the seed layer may be a layer of Cu deposited with a thickness in a range of about 50 angstroms to about 300 angstroms (preferably, 100 angstroms).

Figure 1F:
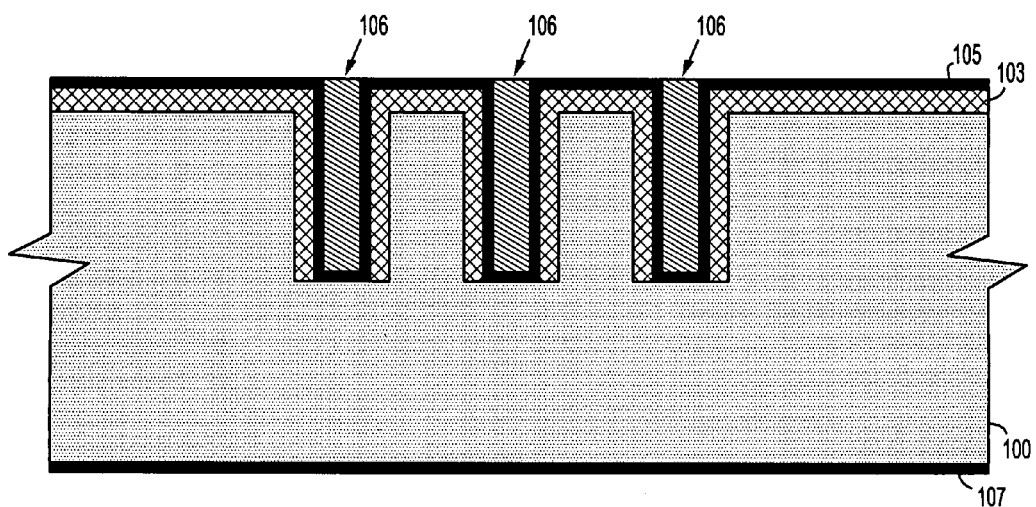

A next step in the exemplary method is to fill the via holes (104) with a conductive material such as copper. In one exemplary embodiment, the via holes (104) are filled with copper using a thru mask plating process that fill the holes (104) from the bottom (closed end) up). To facilitate this process, as further depicted in FIG. 1E, a metallic contact layer (107) such as aluminum, is formed on the backside of the wafer (100). The wafer (100) is placed in an appropriate copper electroplating apparatus which makes electrical contact to the metal layer (107) on the backside of the wafer (100). Copper is then deposited to fill the via holes (104) with copper material from the bottom up to form conductive inner cores (106), as illustrated in FIG. 1F. In the exemplary embodiment of FIG. 1E, the dielectric layer (103) serves to impeded current flow to the top surface of the wafer (100) and to sidewalls of the via feature, thereby forcing current to flow only through the bottom of the via holes (104) with the liner layer (105) on the bottom of the via holes serving as a seed layer. The thru-mask plating fills the holes (104) from the bottom up thereby eliminating the issues of pinch off and electrolyte trapping encountered in a damascene type process flow. Moreover, through mask plating eliminates the need for post plating CMP of copper, since copper is not deposited on the surface of the substrate. This process can sufficiently fill features with nigh aspect ratios in excess of around 25:1, where the higher aspect ratios minimize the impact on CTE and allow for multiple vias per interconnect and redundancies for yield enhancement.

Figure 1G:
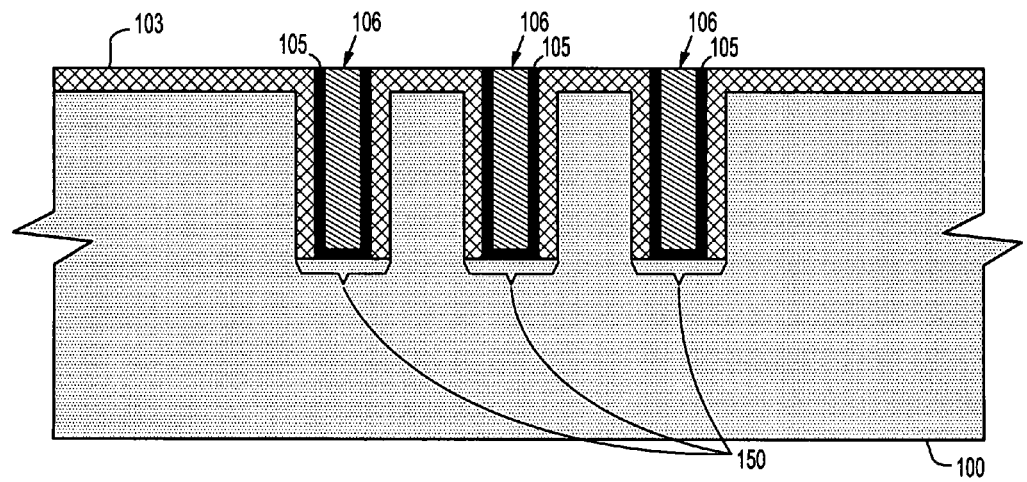
Figure 1H:
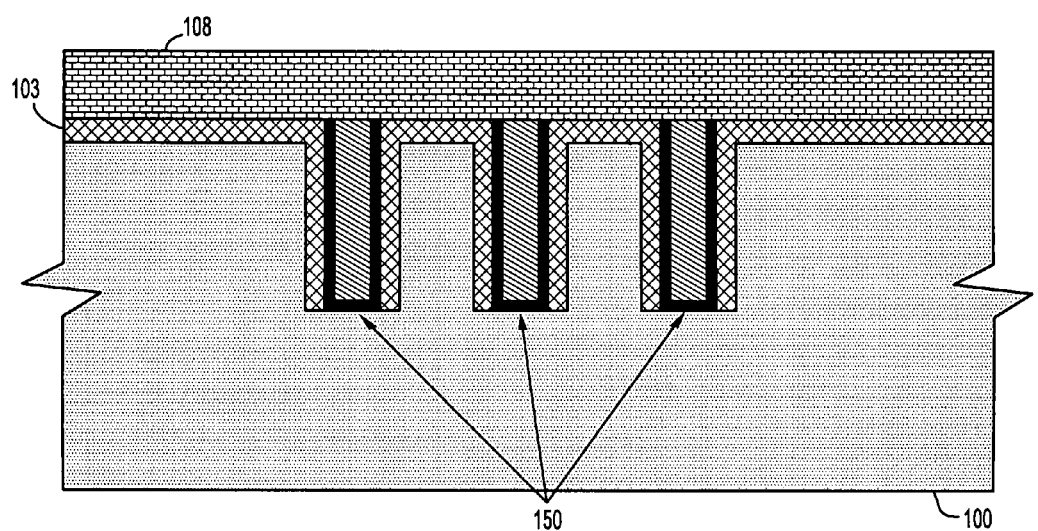

Referring to FIG. 1G, a CMP process is performed to remove the liner/harrier layer (105) on the upper surface of the wafer (100) and planarize the surface of the wafer (100), and the backside metal layer (107) is removed from the bottom surface of the wafer (100). This process results in a plurality of closed end vias (150) each comprising an annular ring of insulating material (103), annular ring of liner (105) and an inner conductive core (106) of metal (e.g., copper). At this point, a BEOL (back end of line) process may be performed using conventional methods to form one or more levels of interconnections on the upper surface of the wafer (100) over the vias (150), such as illustrated in FIG. 1H. The through-vias (150) formed by the methods above were shown to support standard BEOL processing, thermal cycling and electrical and mechanical stressing.

Figure 1I:
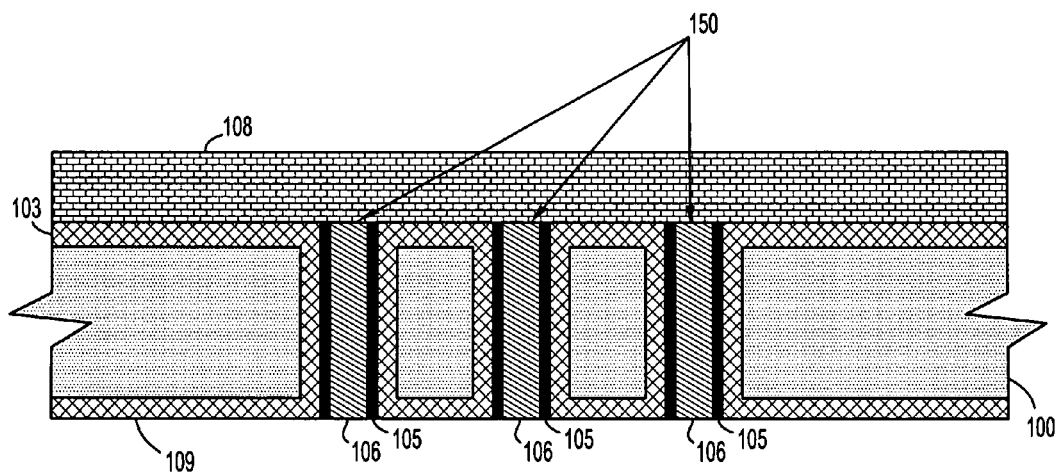

Next, the backside of the wafer (100) is subjected to a grinding and polishing process to expose the bottom ends of the through-vias (150), and a layer of insulating material (109) is formed to insulate the back surface of the wafer (100), resulting in the carrier structure of FIG. 1I with conductive through-vias (150) at the desired thickness. This process may be performed using conventional grinding, polishing and/or chemical etch processes. For instance, a backside grind and polish can be performed on the back surface of the wafer (100) to remove the silicon material within 10-20 microns of bottom of the vias (150). A wet etch can then be performed to expose the bottom portions of the dielectric (103), liner (105) and conductive core (106), recess the silicon past the bottoms of the vias (150). A blanket layer of oxide (109), or other insulating material is deposited and polished (via CMP) to expos the bottoms of the vias (150), such that the back surface of the silicon wafer (100) is thus completely insulated by the insulating layer (109) and but with the bottoms of the vias (150) exposed.

Figure 1J:
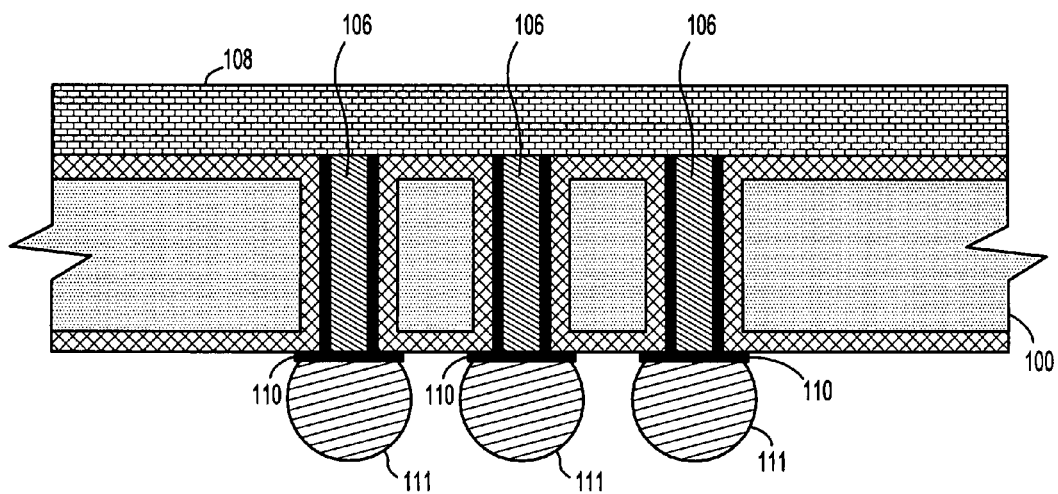

Thereafter, metal pads (110) (e.g., Cr/Cu BLM) and C4 (111) solder balls (e.g., Pb/Sn solder) can be deposited over the exposed bottom surfaces of the vias (150), resulting in the silicon carrier structure depicted in FIG. 1J. The insulation layer (109) insulates the contacts (110) from the silicon substrate (100).

Figure 2A:
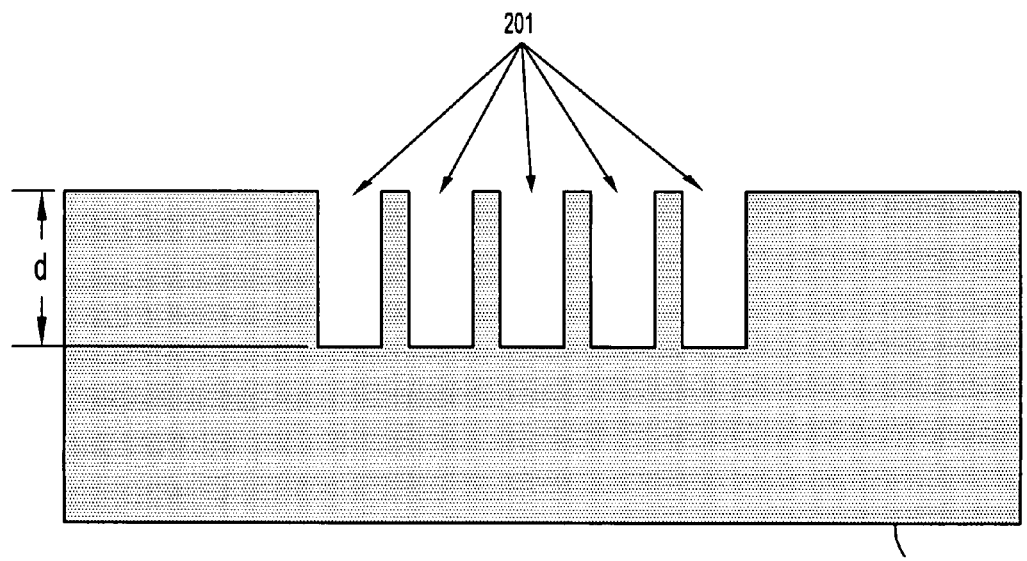
FIGS. 2A~2I schematically illustrate a method for fabricating a silicon carrier with through-via interconnects according to another exemplary embodiment of the invention.

FIGS. 2A~2I schematically illustrate a method for fabricating a carrier with thru-via interconnects according to another exemplary embodiment of the invention. FIG. 2A illustrates initial steps in the exemplary process where a semiconductor wafer (200) is etched to form a plurality of annular, closed-end via holes (201) to a depth, d, below a front side surface of the wafer (200). The via holes (201) can be formed using any suitable anisotropic dry or wet etching process. In one exemplary embodiment, the Bosch-type deep RIE is utilized as such etching method includes alternating deposition and passivation steps that form through-vias with smooth, straight sidewalls to depths of 300 μm, as is known in the art.

Figure 2B:
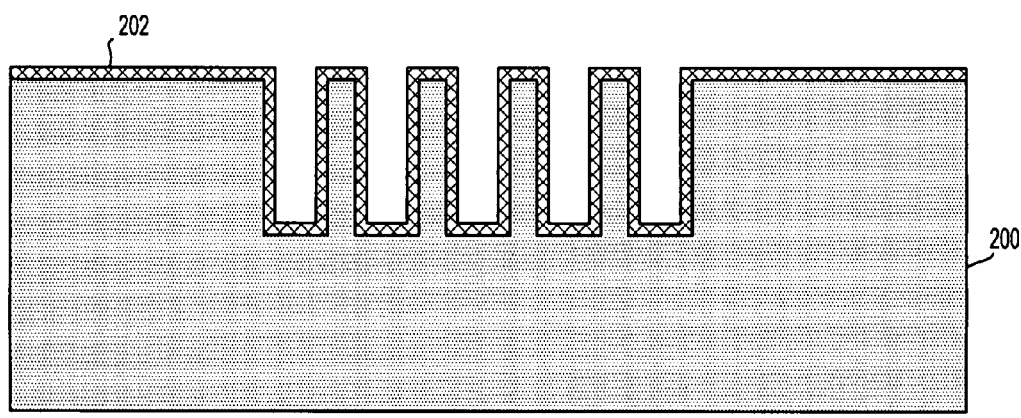

Following formation of via holes (201), an insulating or dielectric material is deposited or grown to form insulating layer (202) to line the sidewalls of the via holes (201), such as depicted in FIG. 2B. The insulating layer (202) may be formed of one or more insulator materials such as an oxide and or nitride. For example, the dielectric layer (202) may be an oxide that is grown or deposited using known techniques, such as, thermal oxidation, CVD (chemical vapor deposition), or a nitride that is formed by CVD, etc. In another embodiment, the insulating layer (202) may be formed of a thermal oxide with added filler material such as poly-Si other material so that the dielectric layer (202) provides sufficient insulation characteristics while forming a controlled stress insulator layer having a CTE that is more closely matched to that of the silicon material of the substrate (200).

Figure 2C:
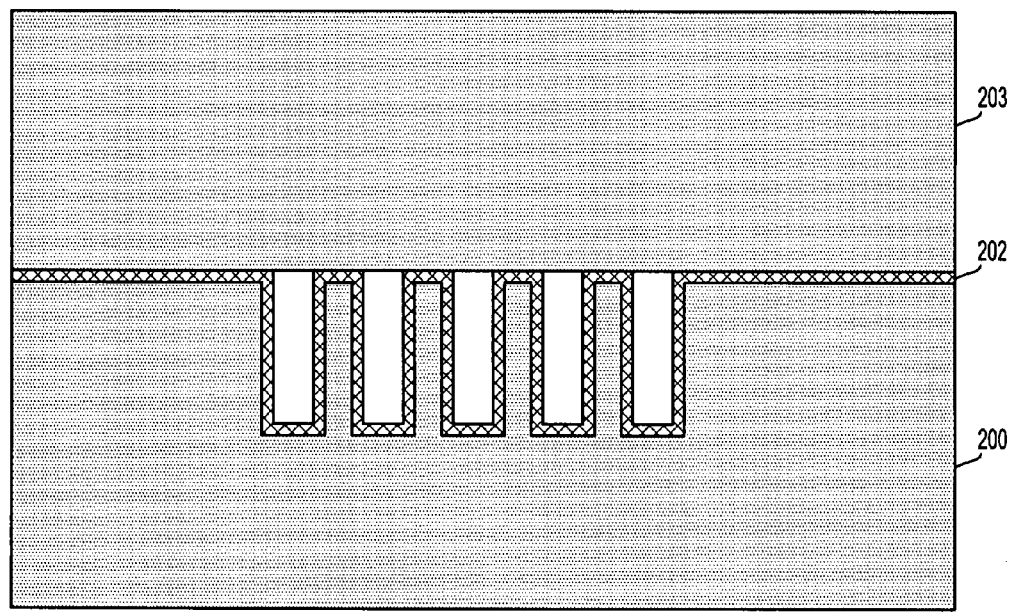
Figure 2D:
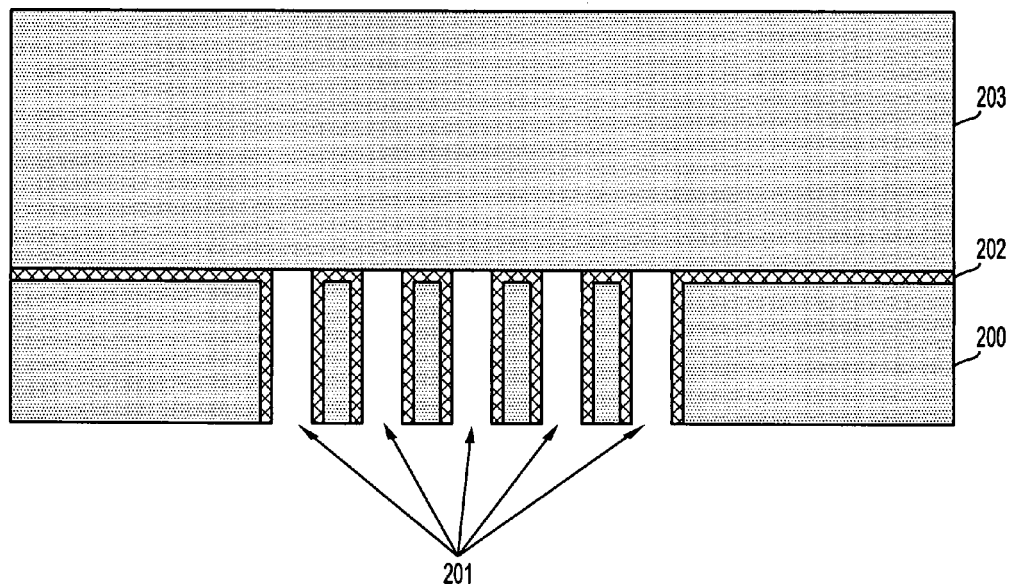

Next, a carrier wafer (203) with a backside dopant implant is bonded to the front side of the first wafer (200) resulting in the structure depicted in FIG. 2C. The backside of the first wafer (200) is then subjected to a grinding and polishing process to remove the excess substrate material and expose the vias holes (201), resulting in the structure depicted in FIG. 2D.

Figure 2E:
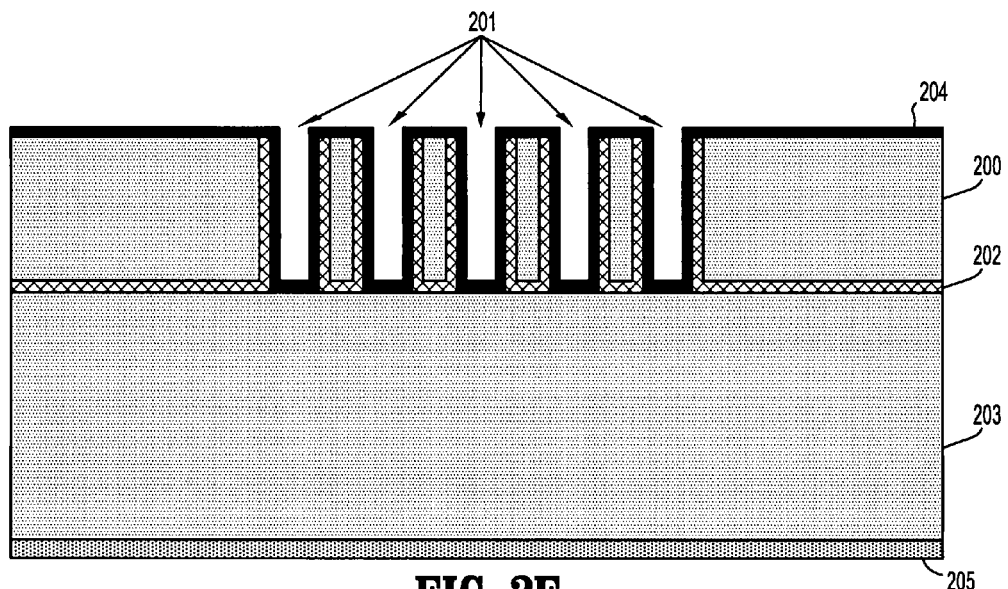

Referring to FIG. 2E, a barrier/adhesion layer (204) (or liner layer) is formed to line the exposed insulated sidewall and bottom surfaces of the via holes (201). The liner layer (204) may be deposited in one layer or stacked layers. For instance, a first layer may be deposited providing a barrier layer which prevent migration of material into the substrate. A second layer may be an adhesion layer formed on the barrier layer to that forms good adhesion to both the barrier metal and to a third metal (e.g., copper) that fills the via holes. In particular, the liner layer (204) may be formed by depositing one or more conformal layers of TaN, Ta, Ru, Ti, and/or TiN using PVD, CVD, ALD, etc. A single layer of TiN functions as both a barrier metal and adhesion layer. If a barrier metal other than TiN is utilized, an adhesion layer may be deposited including adhesion metals such as chromium, titanium or titanium tungsten, using known techniques.

Figure 2F:
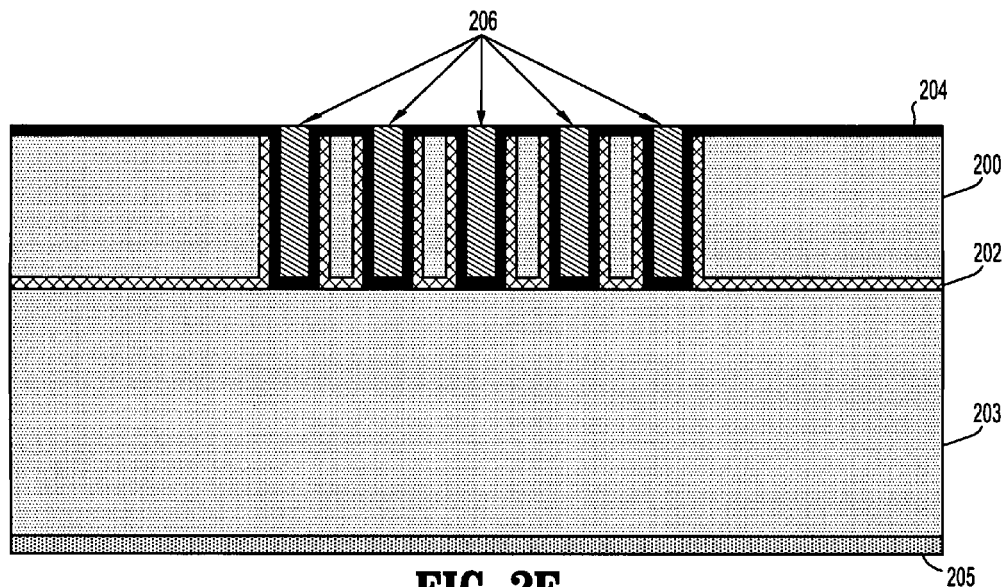

A next step in the exemplary method is to fill the via holes (201) with a conductive material such as copper. In one exemplary embodiment, the via holes (201) are filled with copper using a thru mask plating process that fill the holes (201) from the bottom (closed end) up). To facilitate this process, as further depicted in FIG. 2E, a metallic contact layer (205) such as aluminum is formed on the backside of the carrier wafer (203), which serves as an electrical contact to a copper electroplating apparatus. A copper electroplating process is them performed to fill the via holes (201) with copper material from the bottom up to form the conductive inner cores (206), as illustrated in FIG. 2F. In the exemplary embodiment of FIG. 2E, the insulating layer (202) serves to impeded current flow to the top surface of the wafer (200) and to sidewalls of the via features, thereby forcing current to flow only through the bottom of the via holes (201) with the liner layer (204) on the bottom of the via holes which are coated with the liner material serving as a seed layer.

Figure 2G:
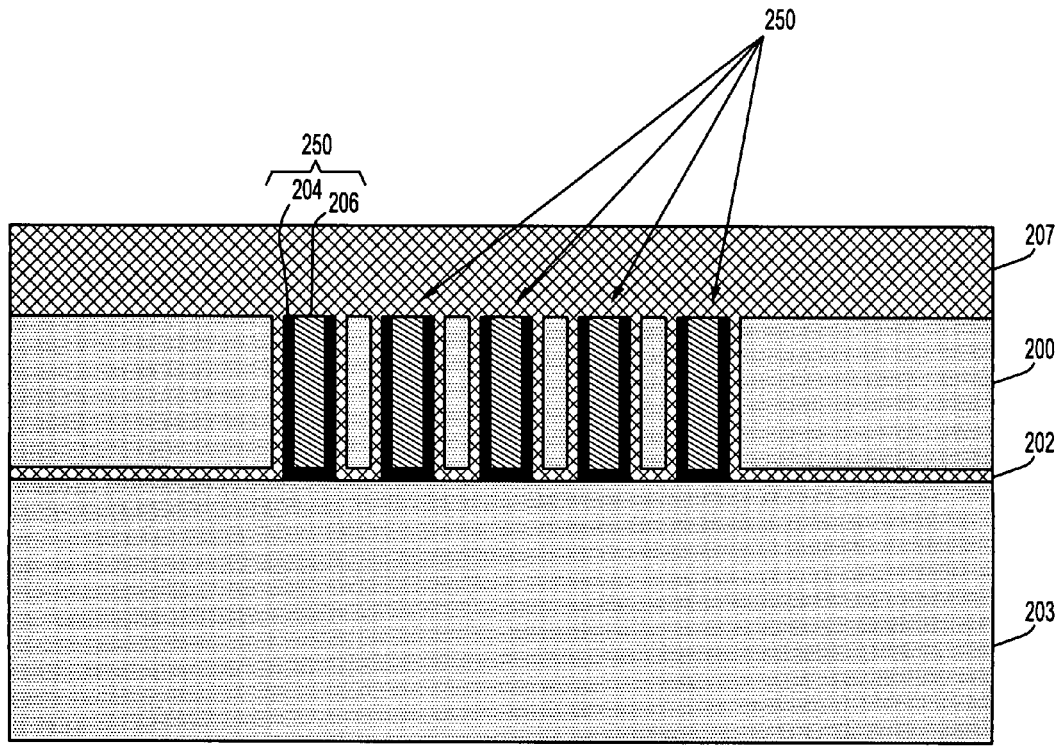

The structure of FIG. 2F is subjected to a CMP process to remove the liner layer (204) on the upper surface of the wafer (200) and planarise the surface of the wafer (200), and the backside metal layer (205) is removed from the bottom surface of the carrier wafer (203). This process results in a plurality of closed end vias (250) each comprising an annular ring of insulating material (202), annular liner (204) and an inner conductive core (206) of metal (e.g., copper). At this point, a BEOL (back end of line) process may be performed using conventional methods to form one or more levels of interconnections (207) on the upper surface of the wafer (200) over the vias (250), such as illustrated in FIG. 2G. The through-vias (250) formed by the methods above were shown to support standard BEOL processing, thermal cycling and electrical and mechanical stressing.

Figure 2H:
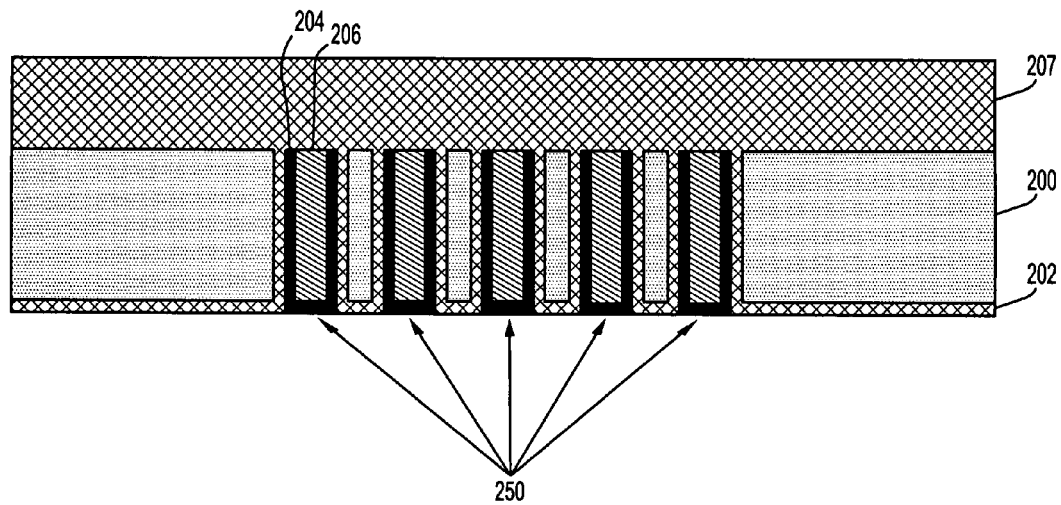
Figure 2I:
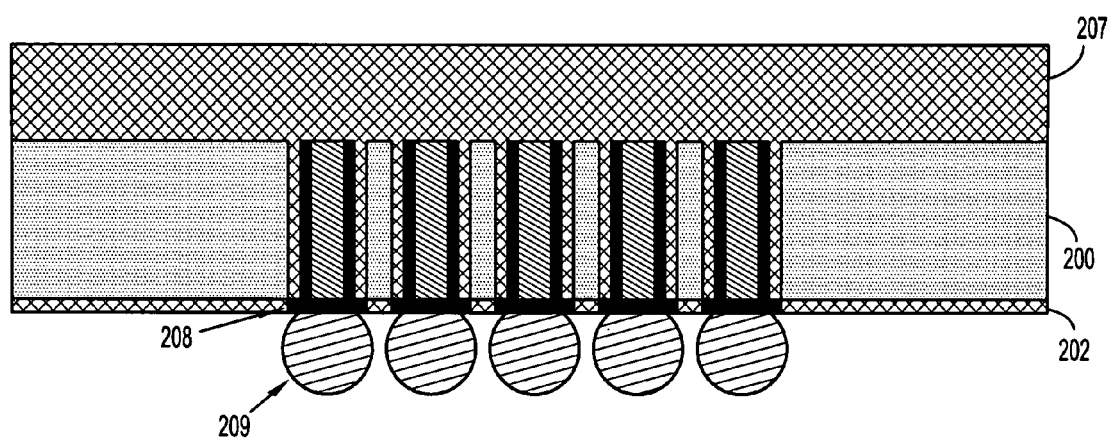

Next, the backside of the carrier water (203) is subjected to grinding/polishing and or dry/wet etch processes to remove the silicon material down to the insulating layer (202) to expose the bottom ends of the through-vias (250), resulting in the structure of FIG. 2H. This process may be performed using conventional methods. Thereafter, metal pads (203) (e.g., Cr/Cu BLM) and C4s (209) solder balls (e.g., Pb/Sn solder) can be deposited over the exposed bottom surfaces of the vias (250), resulting in the silicon carrier structure depicted in FIG. 2I. The insulation layer (202) insulates the contacts (208/209) from the silicon substrate (200).

Figure 3A:
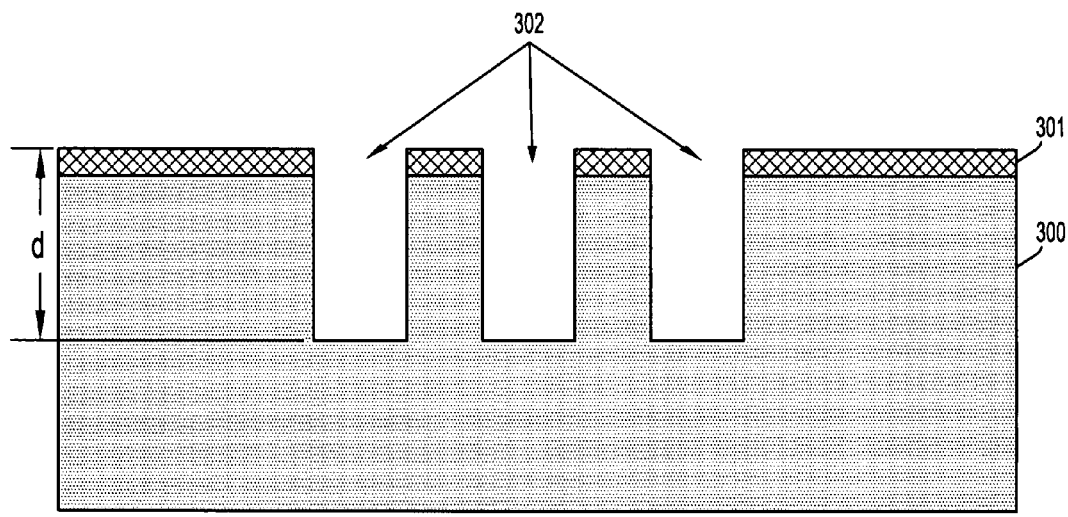
FIGS. 3A~3H schematically illustrate a method for fabricating a silicon carrier with through-via interconnects according to another exemplary embodiment of the invention.

FIGS. 3A~3H schematically illustrate a method for fabricating a carrier with thru-via interconnects according to another exemplary embodiment of the invention FIG. 3A illustrates initial steps in the exemplary process where a semiconductor wafer (300) having a first insulating layer (301) is etched to form a plurality of annular, closed-end via holes (302) to a depth, d. The first insulating layer (301) may be an oxide or nitride, etc, that is grown or deposited using methods as described above. The insulating layer (301) is then subjected to an etch process to expose regions of the wafer (300) in which the via holes (302) are to be formed. The via holes (302) are then formed using any suitable anisotropic dry or wet etching process, such as described above.

Figure 3B:
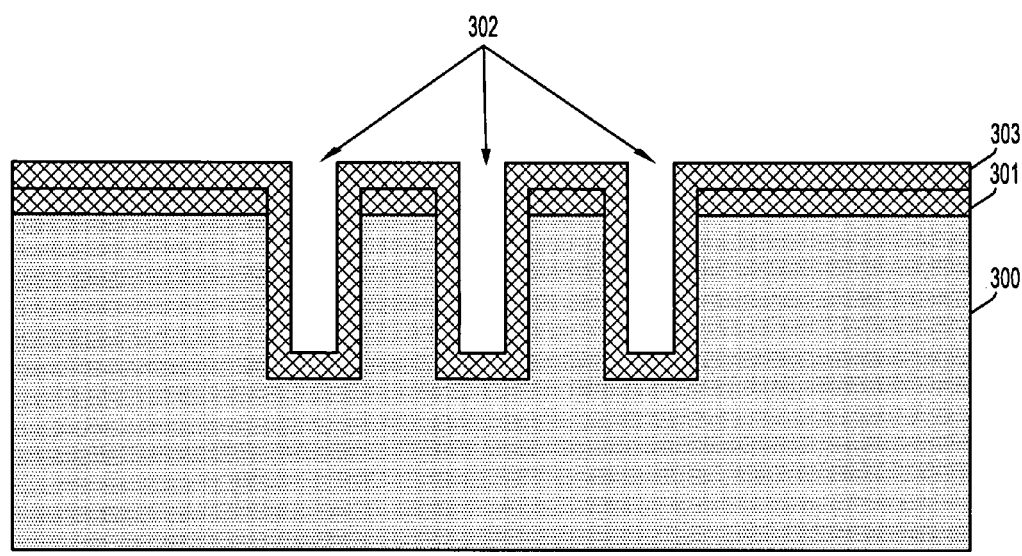
Figure 3C:
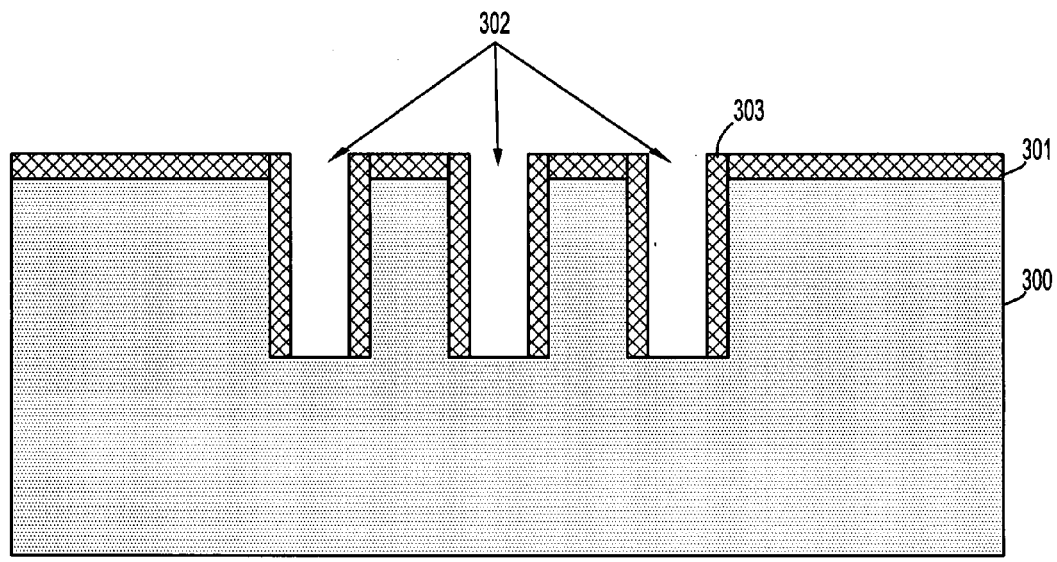
Figure 3D:
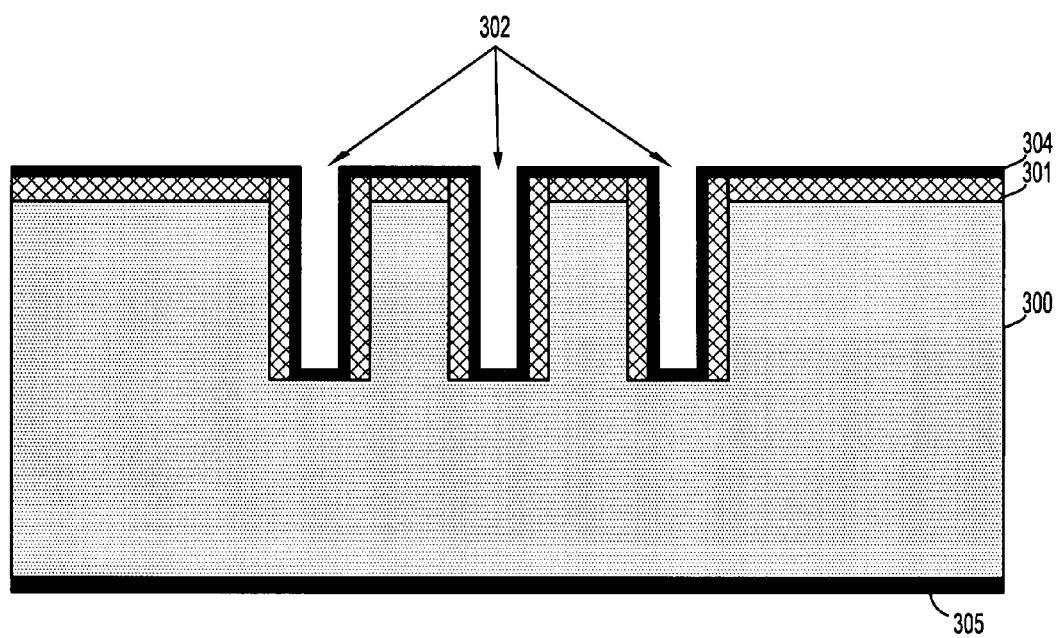

Following formation of via holes (302) a second insulating layer (303) is formed to line the sidewalls of the via holes (302), such as depicted in FIG. 3B. The second insulating layer (303) may be formed of one or more insulator materials such as an oxide and or nitride similar to the first insulating layer (301). An anisotropic etch process (e.g., mask less RIE) is then performed in a controlled manner to etch away the portion of the second insulating layer (303) on the bottom surfaces of the via holes (302) and on the top surface of structure, while maintaining the second insulating layer (303) material on the sidewalls of the via holes (302). This etch process can be performed using RIE. The resulting structure is depicted in FIG. 3C.

Thereafter, the processing steps are similar to those discussed above with reference to FIGS. 1E~1J. Briefly, referring to FIG. 3D, a barrier/adhesion layer (304) (or liner layer) is formed to line the exposed insulated sidewalls and bottom surfaces of the via holes (302) using methods as discussed above. For instance, the liner layer (304) may be formed by depositing one or more conformal layers of TaN, Ta, Ru, Ti, and/or TiN using PVD, CVD, ALB, etc., with an adhesion layer formed by chromium, titanium or titanium tungsten. A metal contact layer (305) such as aluminum is formed on the backside of the wafer (300), which serves as an electrical contact to a copper electroplating apparatus.

Figure 3E:
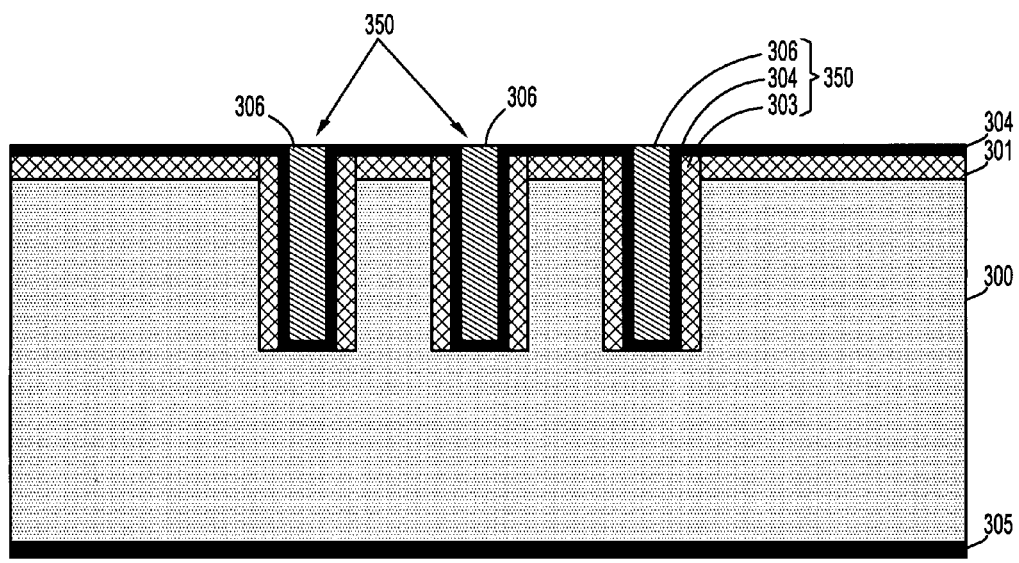
Figure 3F:
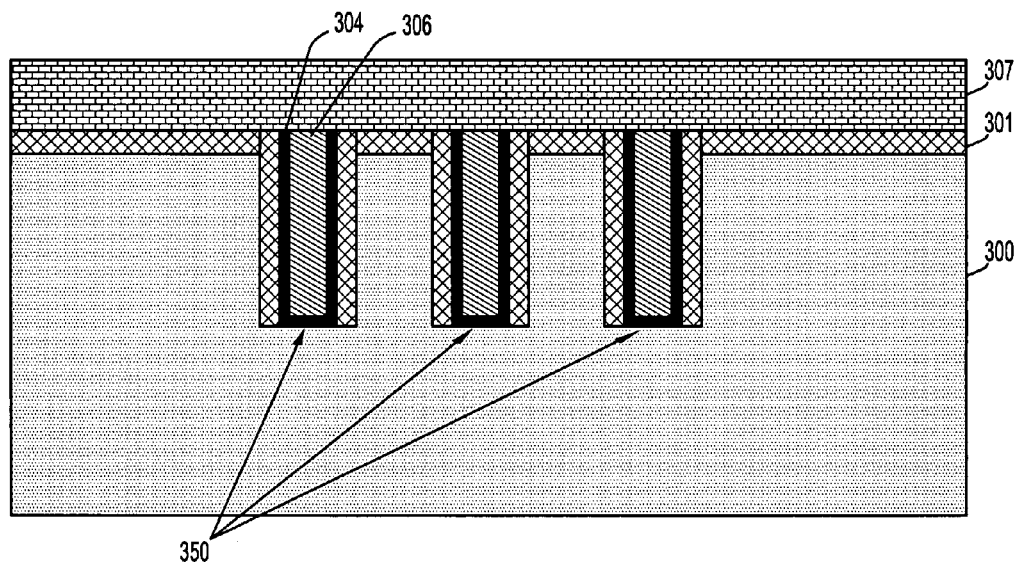

The via holes (302) are filled with a conductive material such as copper using a thru mask plating process to fill the holes (302) from the bottom, (closed end) up and form inner conductive cores (306), as illustrated in FIG. 3E. In the exemplary embodiment of FIG. 3D, the insulating layer (301) serves to impeded current flow to the top surface of the wafer (300) and the insulating layer (303) serves to impede current flow to the sidewalls of the via features, thereby forcing current to flow only through the bottom of the via holes (302) with the liner layer (304) on the bottom of the via holes serving as a seed layer. A CMP process is performed to remove the liner layer (304) on the upper surface of the wafer (300) and planarize the surface of the wafer (300), and the backside metal layer (305) is removed, from the bottom, surface of the wafer (300). A BEOL (back end of line) process may be performed using conventional methods to form one or more levels of interconnections on the upper surface of the wafer (300) over the vias (350), resulting in the structure of FIG. 3F. The through-vias (350) formed by the methods above were shown to support standard BEOL processing, thermal cycling and electrical and mechanical stressing.

Figure 3G:
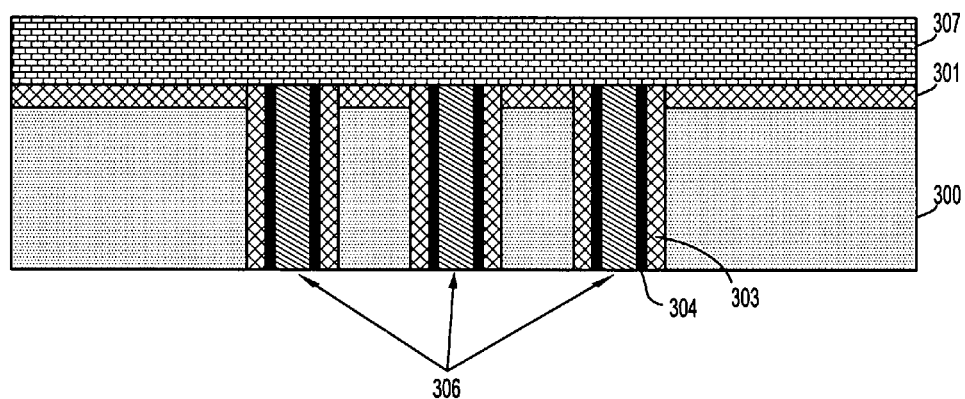
Figure 3H:
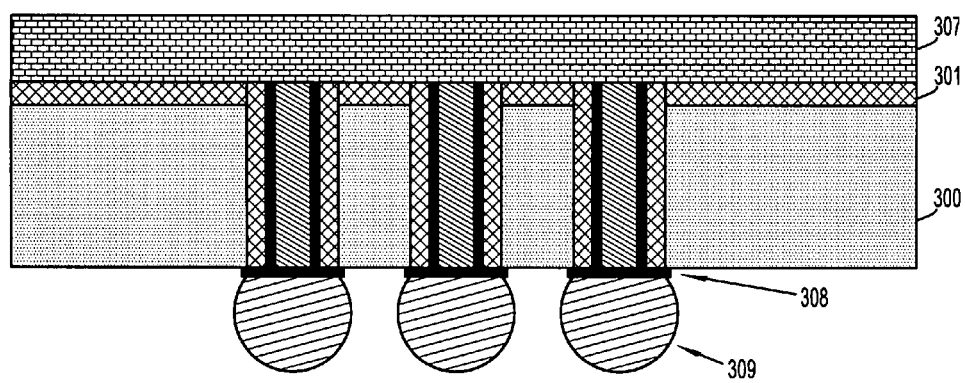

Next, the backside of the wafer (300) is subjected to a grinding and polishing process to expose the bottom ends of the through-vias (350), resulting in the structure of FIG. 3G. Thereafter, metal pads (308) (e.g., Cr/Cu BLM) and C4s (309) solder balls (e.g., Pb/Sn solder) can be deposited over the exposed bottom surfaces of the vias (350), resulting in the silicon carrier structure depicted in FIG. 3H.

Figure 4A:
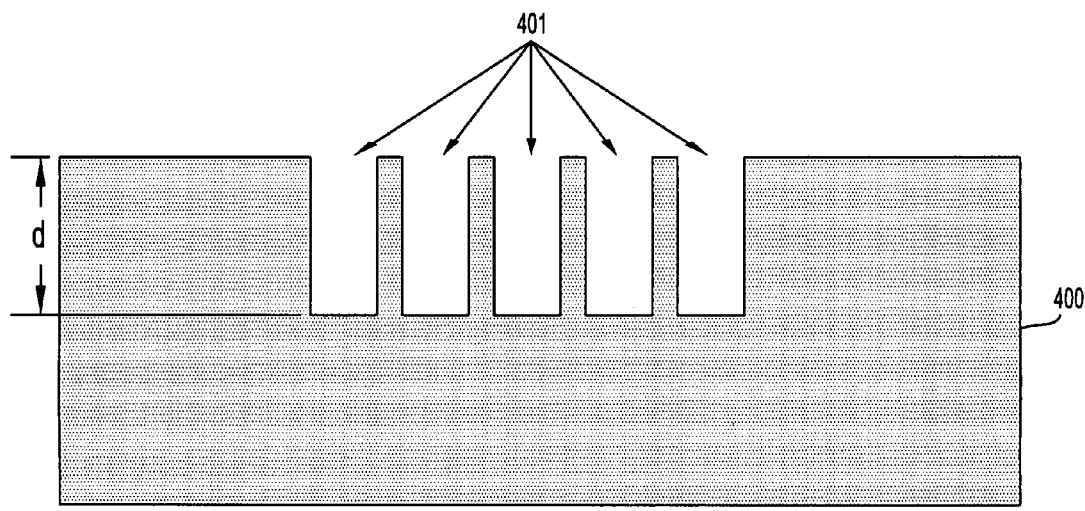
FIGS. 4A~4O schematically illustrate a method for fabricating a silicon carrier with through-via interconnects according to another exemplary embodiment of the invention.
Figure 4B:
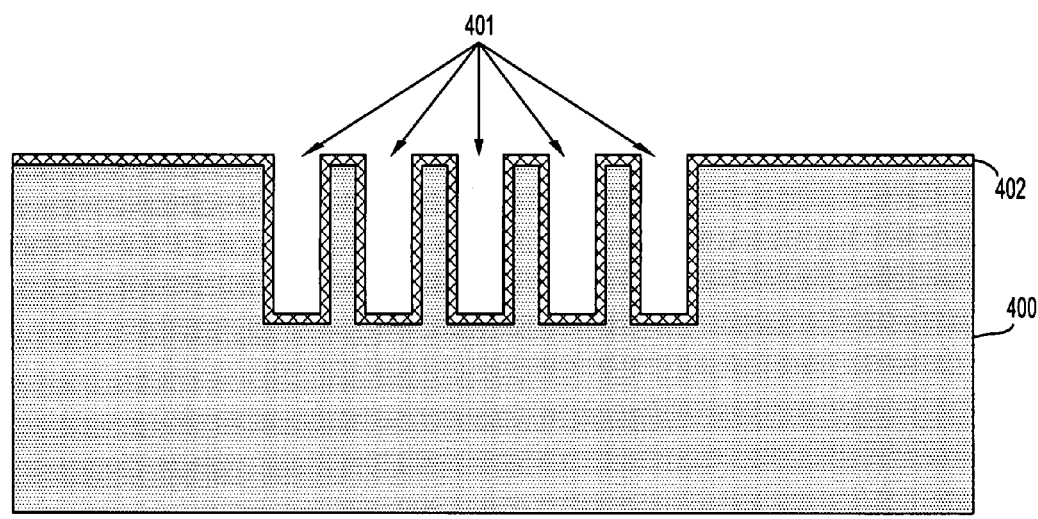

FIGS. 4A~4O schematically illustrate a method for fabricating a carrier with thru-via interconnects according to another exemplary embodiment of the invention. FIG. 4A illustrates initial steps in the exemplary process where a semiconductor wafer (400) is etched to form a plurality of annular via holes (401) to a depth, d, below a front side surface of the wafer (400). The via holes (401) may be etched using exemplary anisotropic dry etch methods as described above, which preferably provide passivation of the exposed etched surfaces. An insulating layer (402) is conformably formed over the surface of the substrate to line the sidewalls and bottoms of the annular via holes (401), such as depicted in FIG. 4B. The insulating layer (402) may be formed of the insulating material and methods as in the exemplary embodiments described above.

Figure 4C:
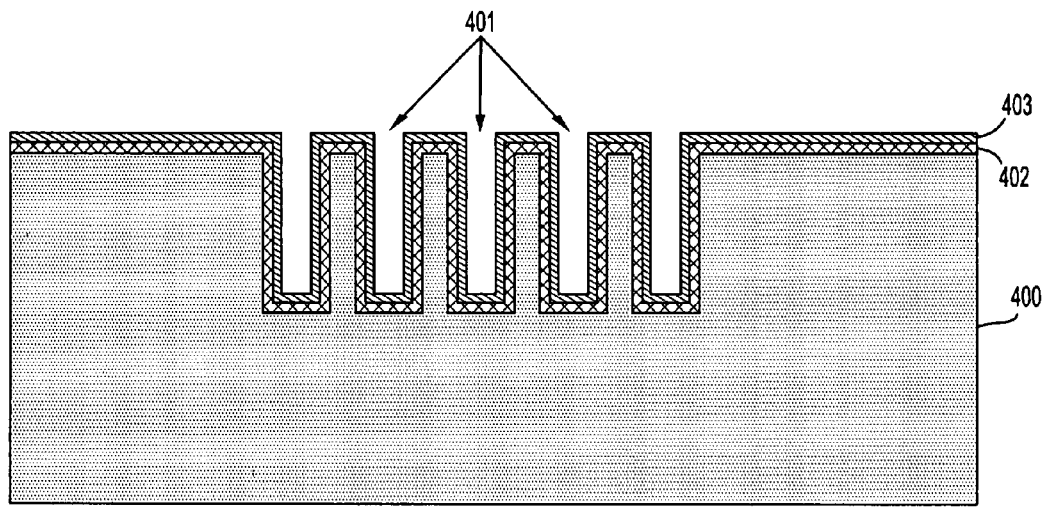

Next, as illustrated in FIG. 4C, a barrier/adhesion layer (403) (or liner layer) is formed on the exposed insulated side-walls and bottom surfaces of the via holes (401) using methods and materials as in the exemplary embodiments discussed above. For instance, the liner layer (403) may be formed by depositing one or more conformed layers of TaN, Ta, Ru, Ti, and/or TiN using PVD, CVD, ALD, etc, with an adhesion layer formed by chromium, titanium or titanium tungsten.

Figure 4D:
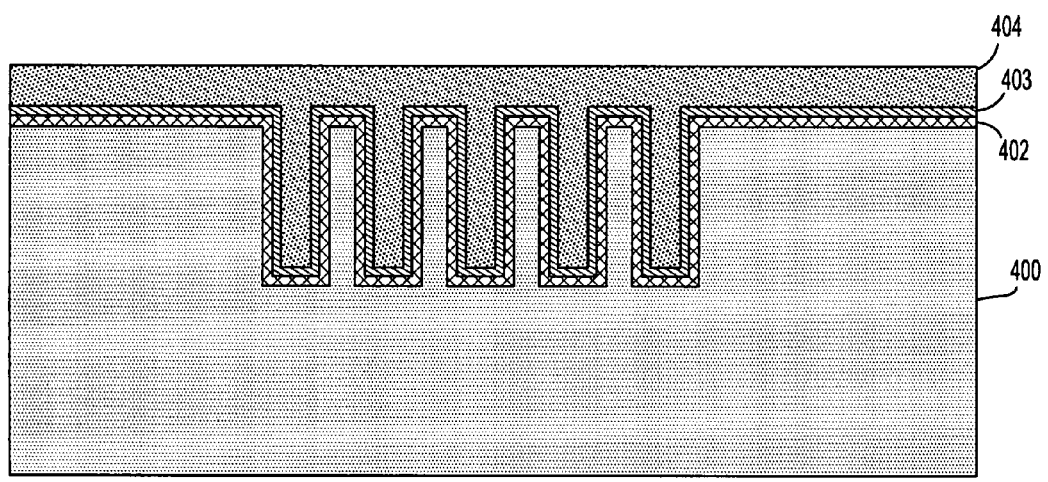
Figure 4E:
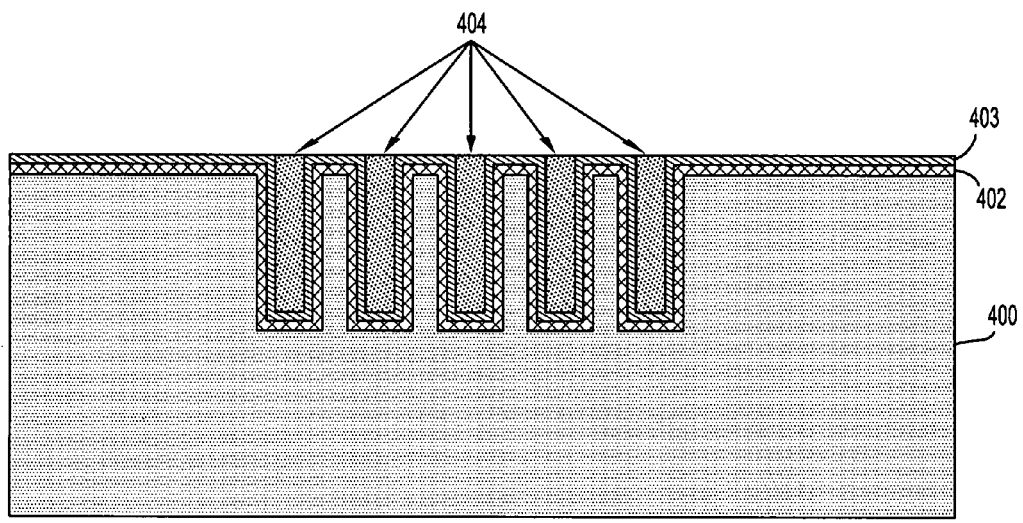

Next, a layer of sacrificial material (404) (such as polymide) is deposited to fill the via holes (401), resulting in the structure depicted in FIG. 4D. The layer of sacrificial material (404) on the surface of the substrate is etched back to expose the liner layer (403) using CMP, for example, while leaving the via holes (401; filled with the sacrificial material (404), such as illustrated in FIG. 4E.

Figure 4F:
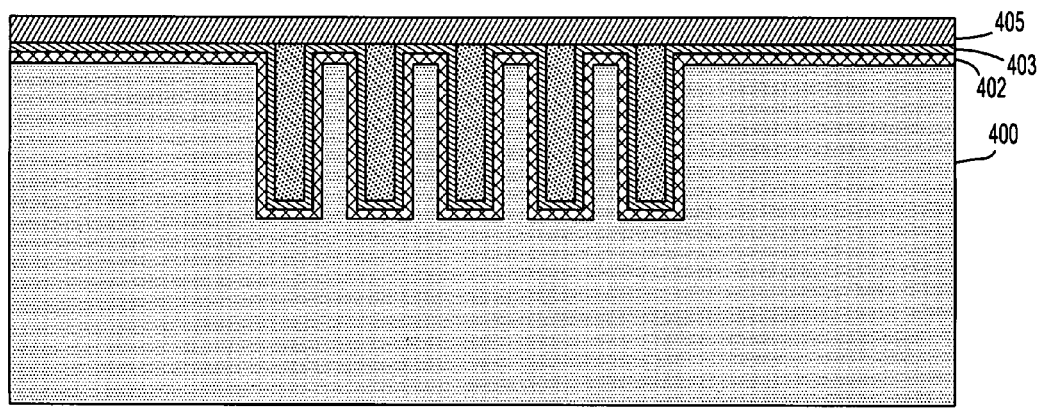
Figure 4G:
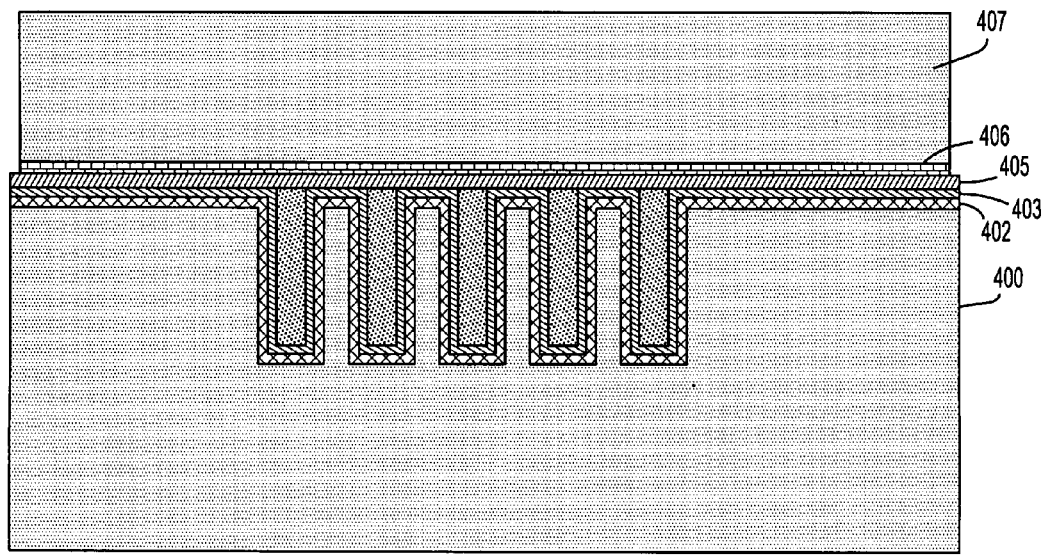
Figure 4H:
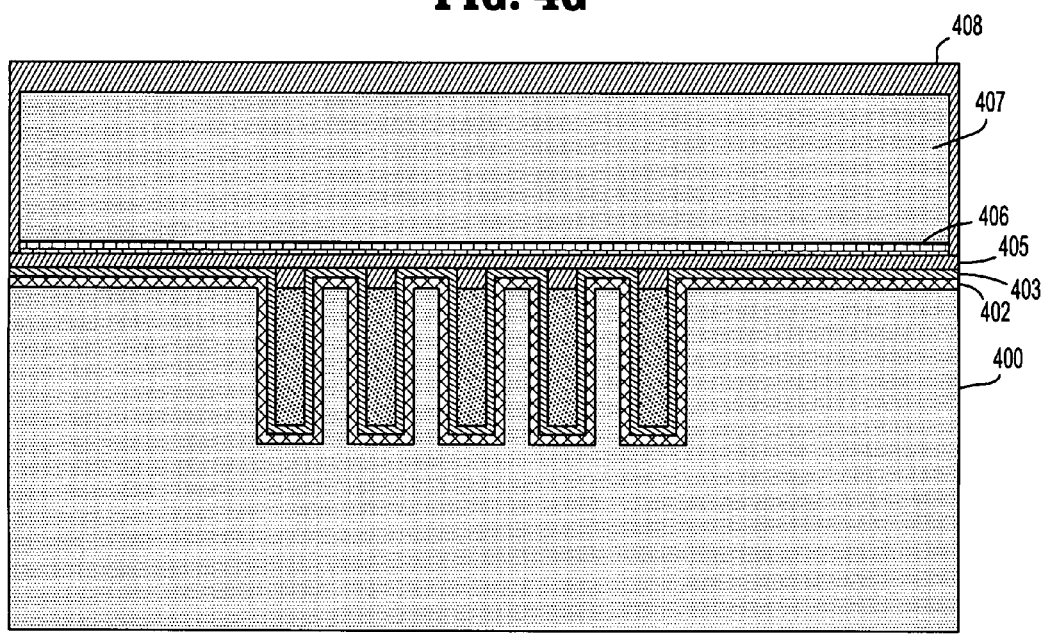

Referring to FIG. 4F, a plating seed layer (405) is then formed over the surface of the substrate. The plating seed layer (405) may be formed of copper, nickel, ruthenium, or other material which is a suitable seed layer for enabling copper nucleation for a subsequent copper plating process. Next, referring to FIG. 4G, a carrier wafer (407), which is slightly smaller in diameter than the substrate wafer (400), is attached to the upper surface of the wafer (400) by either metal to metal bonding or with an adhesive layer (406). A metallic layer (408) is then formed over the backside and sidewalls of the carrier wafer (407) and contacting the exposed end portions of the metallic seed layer (405) on the surface of the wafer (400), resulting the structure of FIG. 4H. The metallic layer (408) in contact with the metallic seed layer (405) results in the formation of a continuous conducting film around the carrier wafer (407).

Figure 4I:
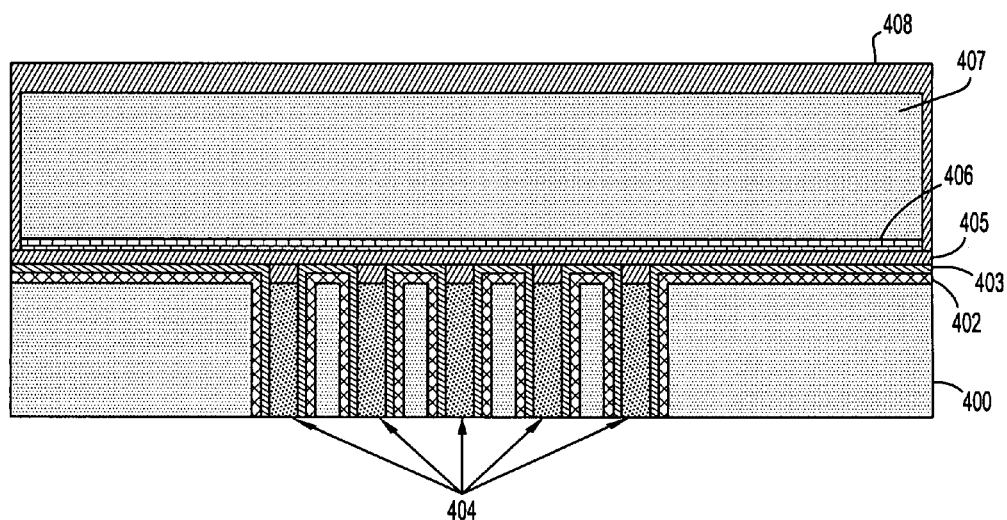
Figure 4J:
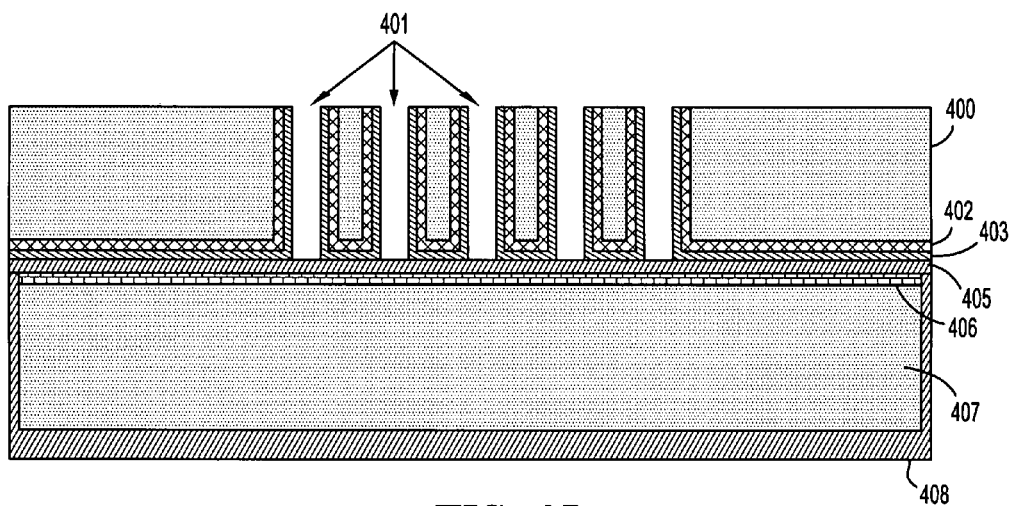

Next, as shown in FIGS. 4I and 4J, the backside of the wafer (400) is thinned by grinding or etching to expose the closed-ends of the vias and expose the sacrificial material (404) in the via holes (401). The sacrificial material (404) is removed from the via holes (401) to expose the portion of the seed layer (405) aligned to the via hole cores. The structure in FIG. 4J is placed in an appropriate copper electroplating apparatus making electrical contact to the conductive layer (408) on the backside of the carrier wafer (407), and the annular via holes (401) are filled with copper from the bottom up using the exposed portions of the seed layer (405) as nucleating sites. In the exemplary embodiment of FIG. 4J, the continuous conductive film formed by layers 408 and 405 serve as direct conductive paths to the bottom of the via holes (401) with the insulating layer (402) serving to impede current flow to the top surface of the wafer (400) and to sidewalls of the via features, thereby forcing current to flow only through the bottom of the via holes (401) with the exposed portions of metallic seed layer (405) on the bottom of the via holes (401) serving as a seed layer. The thru-mask plating effectively fills the holes (401) from the bottom up to form inner conductive cores (409) of the through-vias, such as depicted in FIG. 4K.

Figure 4K:
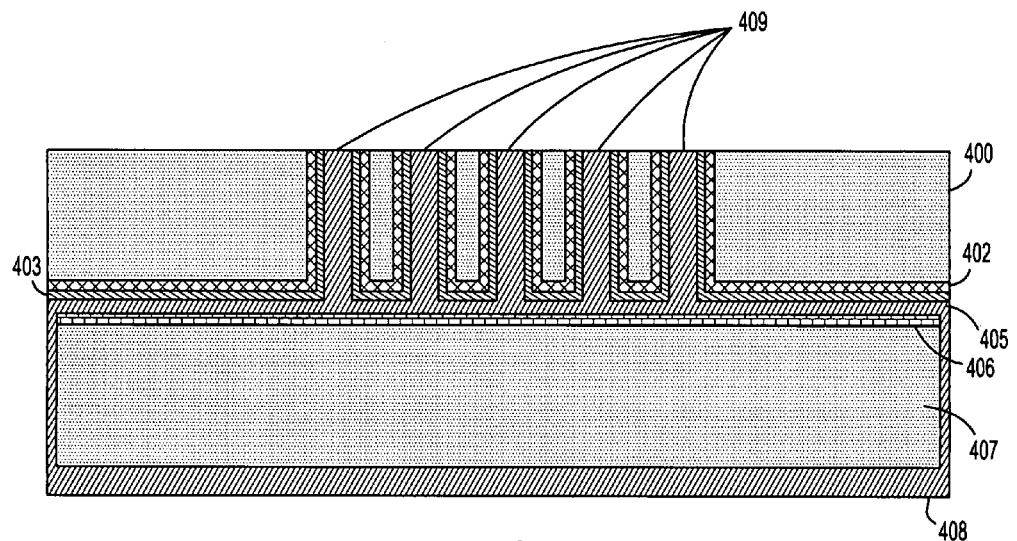
Figure 4L:
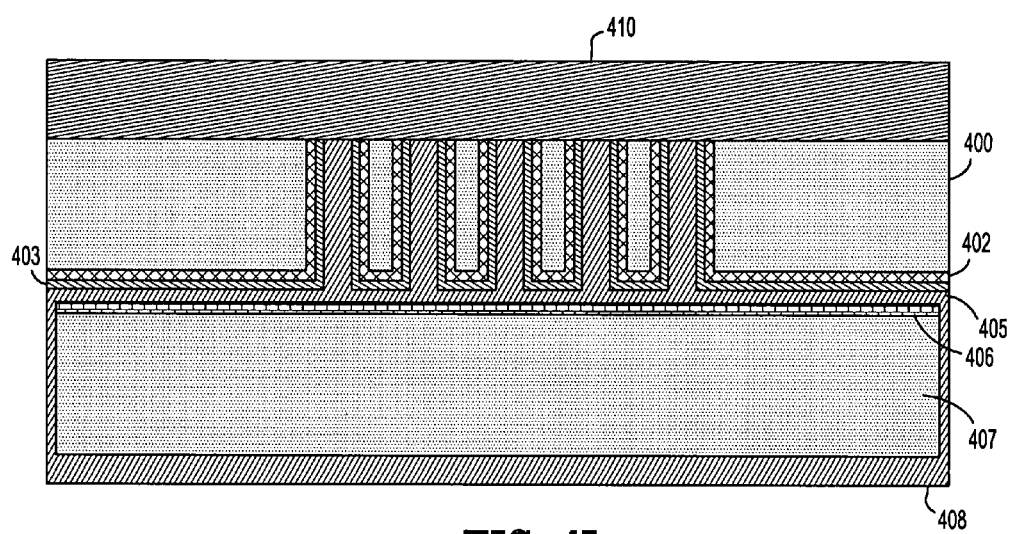
Figure 4M:
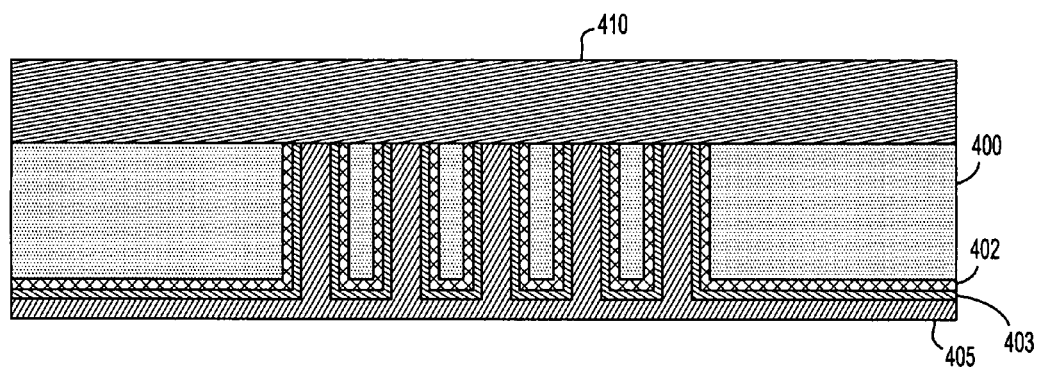
Figure 4N:
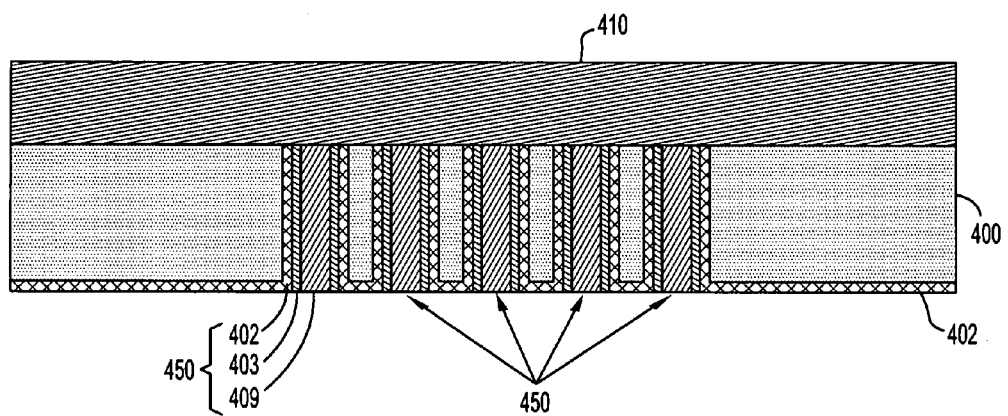
Figure 40:
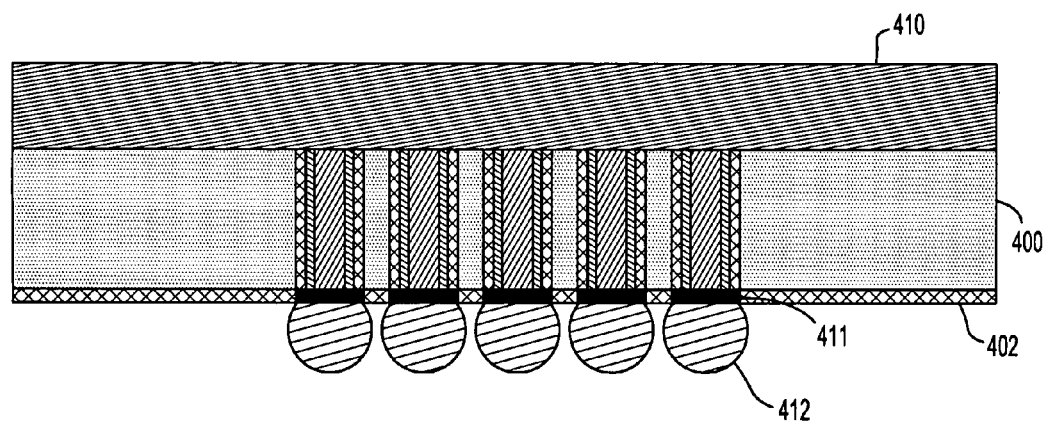

Referring to FIGS. 4K and 4L, following the electroplating process to form the conductive through-via cores (409), the wafer (400) can be slightly planarized to remove non-uniformities, followed by BEOL processing to form an interconnect structure (410) on the planarized surface of the substrate (400). Thereafter, referring to FIGS. 4M and 4N, the backside carrier wafer (407) is removed to expose the seed layer (405), and a polishing process is performed to remove the seed layer (405) and liner layer (403) down to the insulating layer (402) and thus, forming a plurality of electrically isolated through-vias (450). Thereafter, metal pads (411) (e.g., Cr/Cu BLM) and C4s (412) solder balls (e.g., Pb/Sn solder) can be deposited over the exposed bottom surfaces of the vias (450), resulting in the silicon carrier structure depicted in FIG. 4O.

Figure 5A:
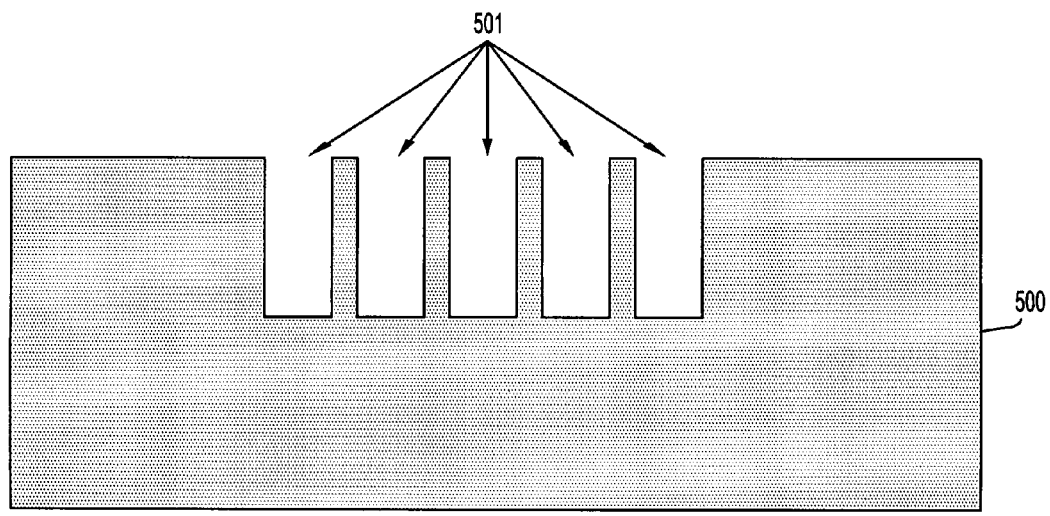
FIGS. 5A~5H schematically illustrate a method, for fabricating a silicon carrier with through-via interconnects according to another exemplary embodiment of the invention.
Figure 5B:
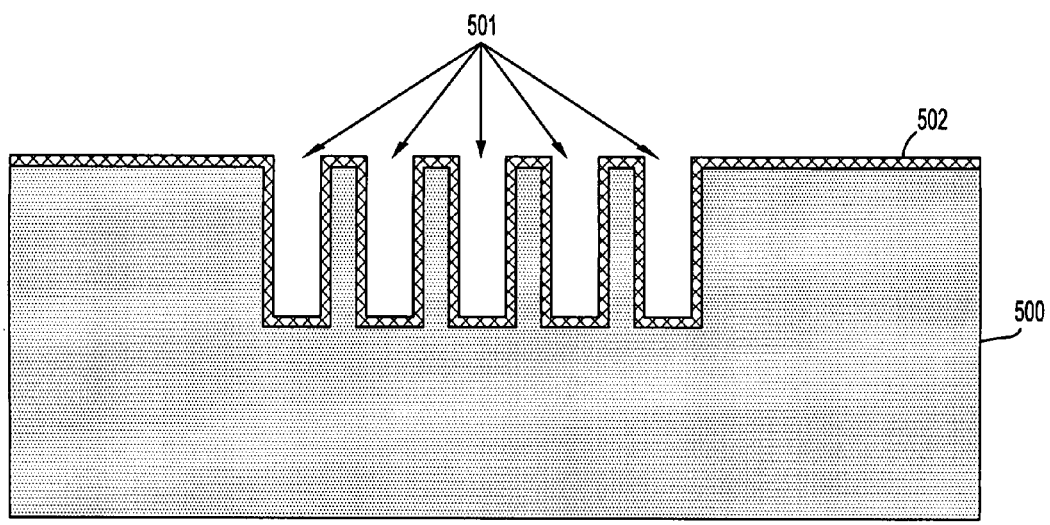

FIGS. 5A~5H schematically illustrate a method for fabricating a carrier with thru-via interconnects according to another exemplary embodiment of the invention. FIG. 5A illustrates initial steps in the exemplary process where a semiconductor wafer (500) is etched to form a plurality of annular via holes (501) to a depth, d, below a front side surface of the wafer (500). The via holes (501) may be etched using exemplary anisotropic dry etch methods as described above/which preferably provide passivation of the exposed etched surfaces. An insulating layer (502) is conformally formed over the surface of the substrate to line the sidewalls and bottoms of the annular via holes (501) with an insulating material, such as depicted in FIG. 5B. The insulating layer (502) may foe formed of the insulating material and methods as in the exemplary embodiments described above.

Figure 5C:
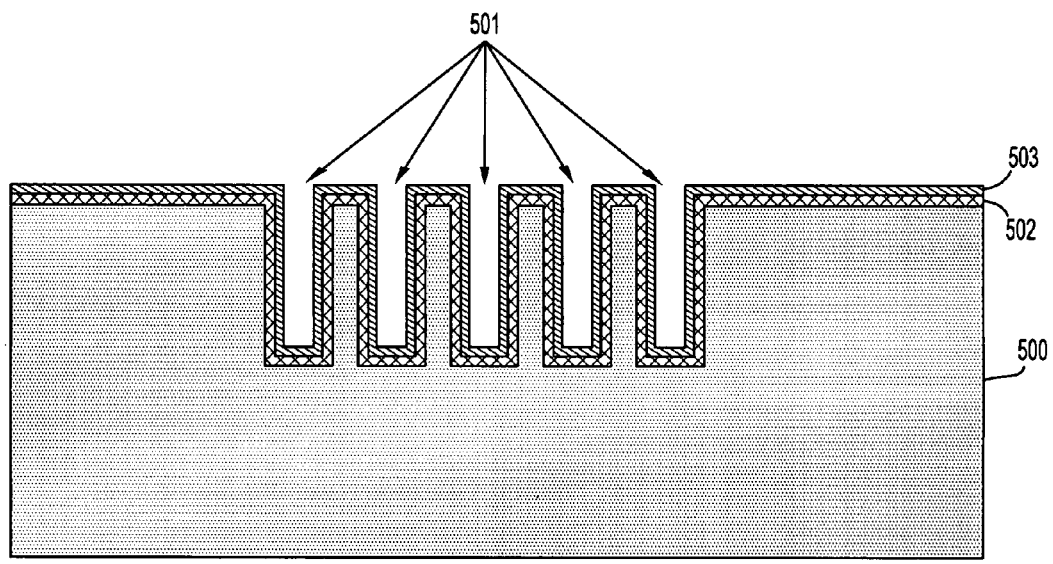

Next, as illustrated in FIG. 5C, a barrier/adhesion layer (503) (or liner layer) is formed to line the exposed insulated sidewalls and bottom surfaces of the via holes (501) using methods and materials as in the exemplary embodiments discussed above. For instance, the liner layer (503) may foe formed by depositing one or more conformal layers of TaN, Ta, Ru, Ti, and/or TiN using PVD, CVD, ALD, etc., with an adhesion layer formed by chromium, titanium or titanium tungsten.

Figure 5D:
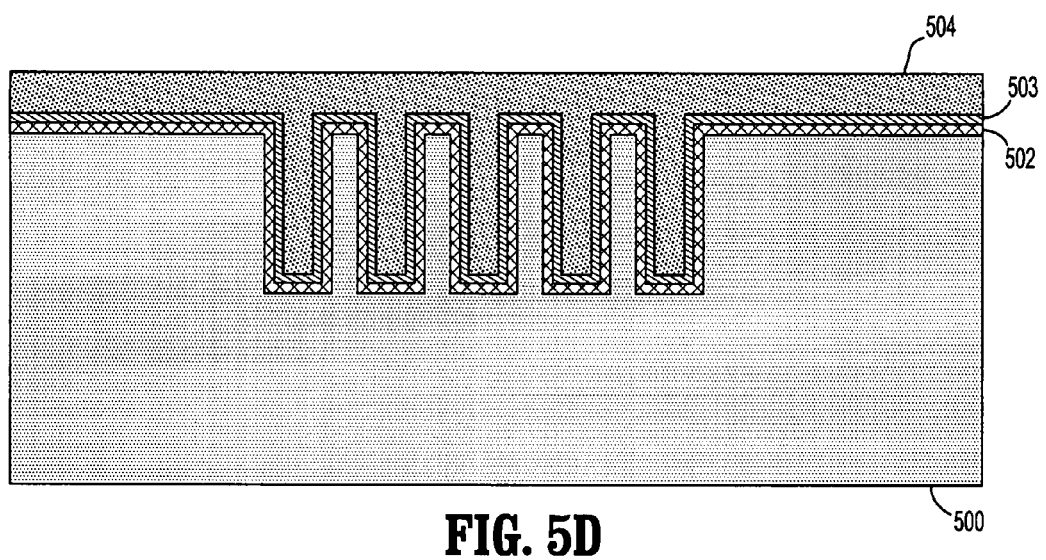
Figure 5E:
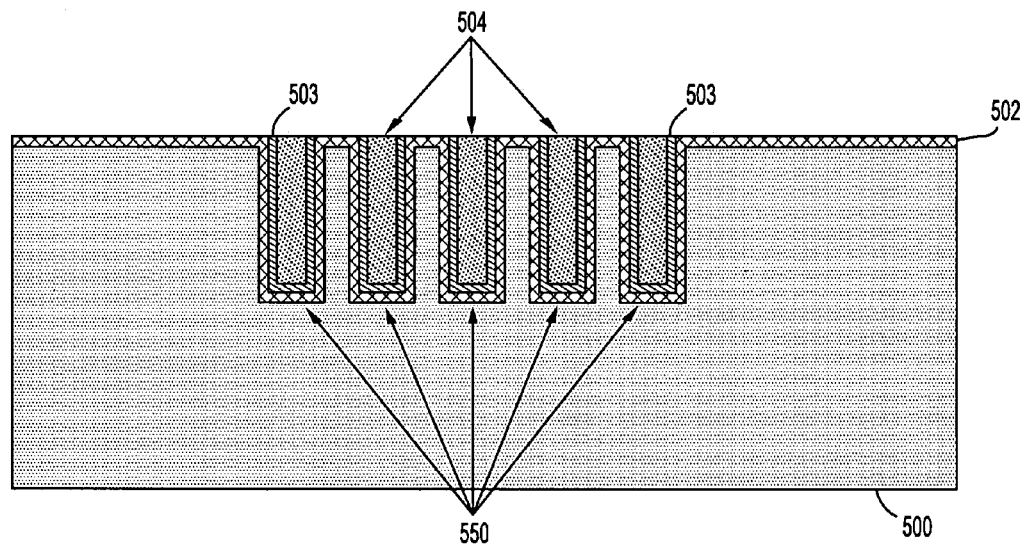

Next, a conformed layer of metallic material (504) such as tungsten (W) or copper (Cu), for example, deposited using CVD, or ruthenium (RU) formed by ALD, or a combination thereof, to fill the via holes (501), resulting in the structure depicted in FIG. 5D. Thereafter, a CMP process is performed to planarize the surface of the wafer (500) and remove the metallic layers (504) and (503) on the surface of the substrate. This process results in formation of a plurality of electrically isolated through-vias (550) as depicted in FIG. 5E.

Figure 5F:
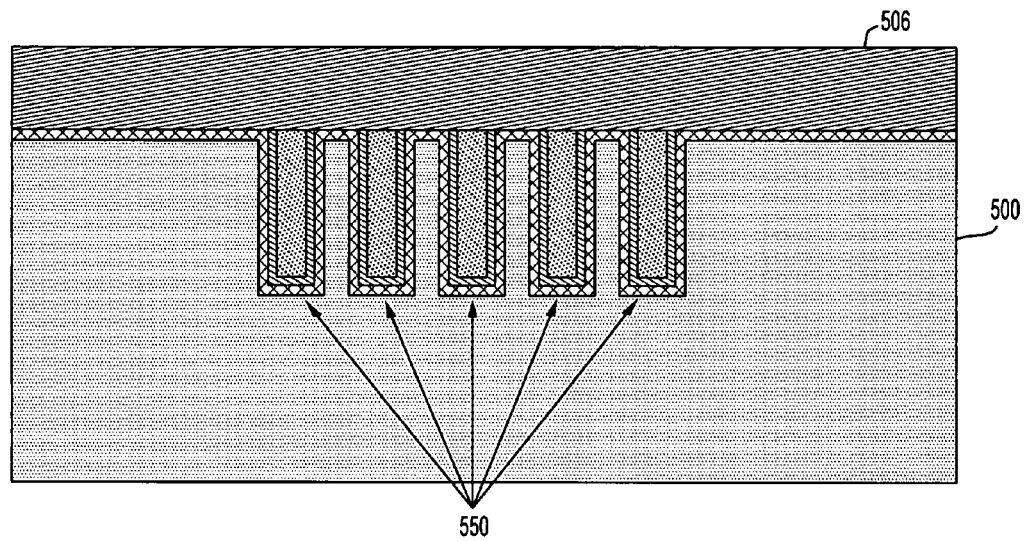

Next, a BEOL process may be performed using conventional methods to form an interconnection structure (506) on the upper surface of the wafer (500) over the vias (550), resulting in the structure of FIG. 5F. The through-vias (550) formed by the methods above were shown to support standard BEOL processing, thermal cycling and electrical and mechanical stressing.

Figure 5G:
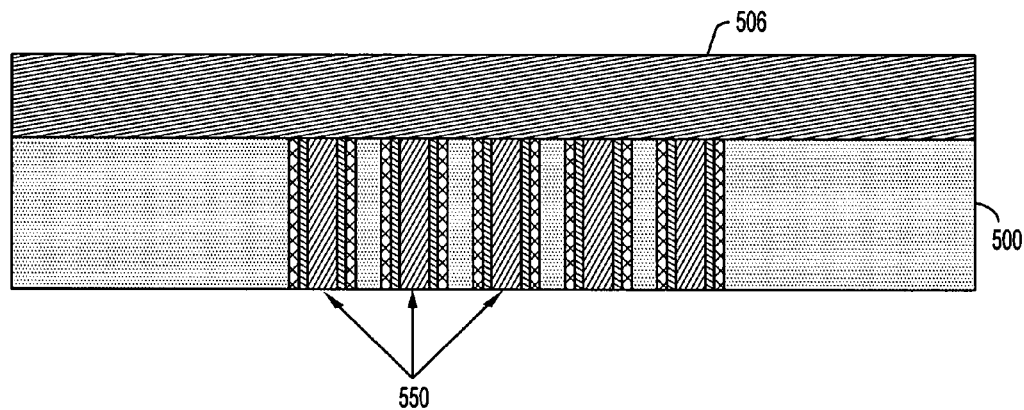
Figure 5H:
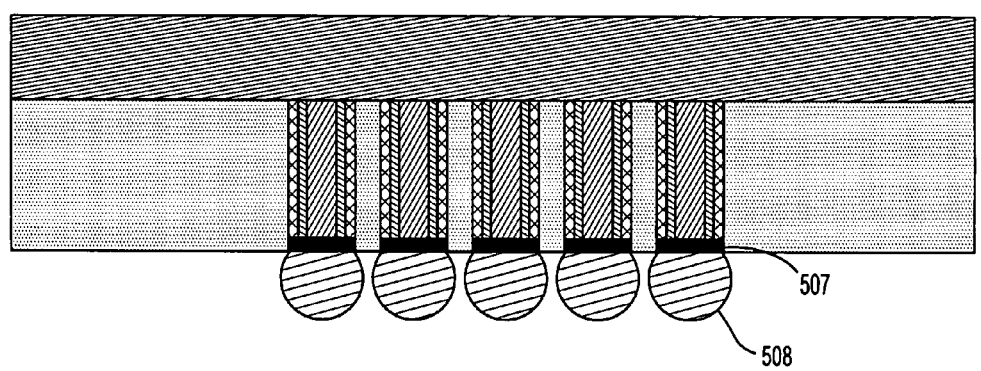

Next, the backside of the wafer (500) is subjected to a grinding and polishing process to expose the bottom (closed) ends of the through-vias (550), resulting in the structure of FIG. 5G. Thereafter, metal pads (507) (e.g., Cr/Cu BLM) and C4 (508) solder balls (e.g., Pb/Sn solder) can be deposited over the exposed bottom surfaces of the vias (550), resulting in the silicon carrier structure depicted in FIG. 5H.

Figure 6A:
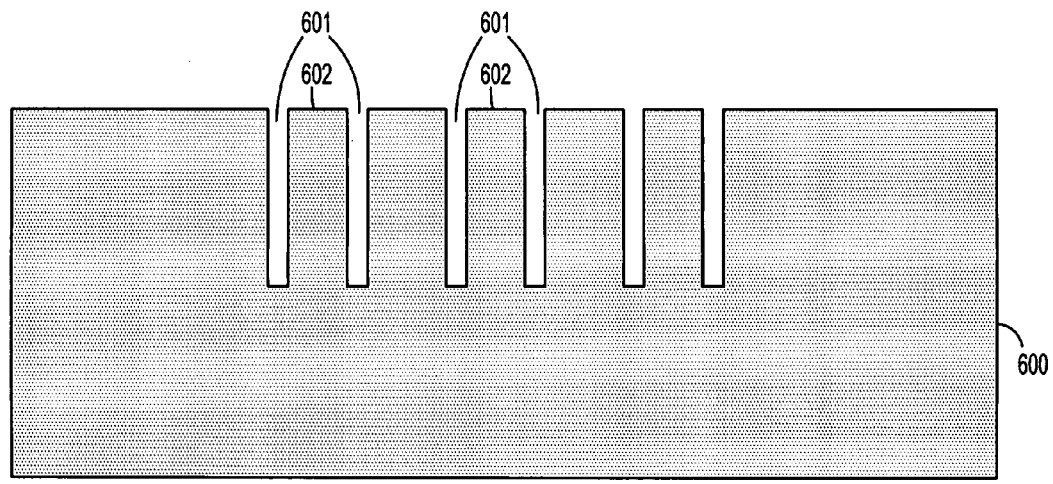
FIGS. 6A~6H schematically illustrate a method for fabricating a silicon carrier with through-via interconnects according to another exemplary embodiment of the invention.

FIGS. 6A~6H schematically illustrate a method for fabricating a carrier with thru-via interconnects according to an exemplary embodiment of the invention. FIG. 6A illustrates initial steps in the exemplary process where a semiconductor wafer (600) is etched to form a plurality of annular trenches (601) to a depth, d, below a front side surface of the wafer (600). Each annular trench (601) surrounds (encircles) an inner core (or post) (602) of substrate material, and formed having an outer diameter, Do representing the diameter of the resulting carrier through-vias, and an inner diameter Di representing the diameter of an inner core (602). The annular trenches (601) can be formed using conventional methods as described above with reference to e.g., FIG. 1A.

Figure 6B:
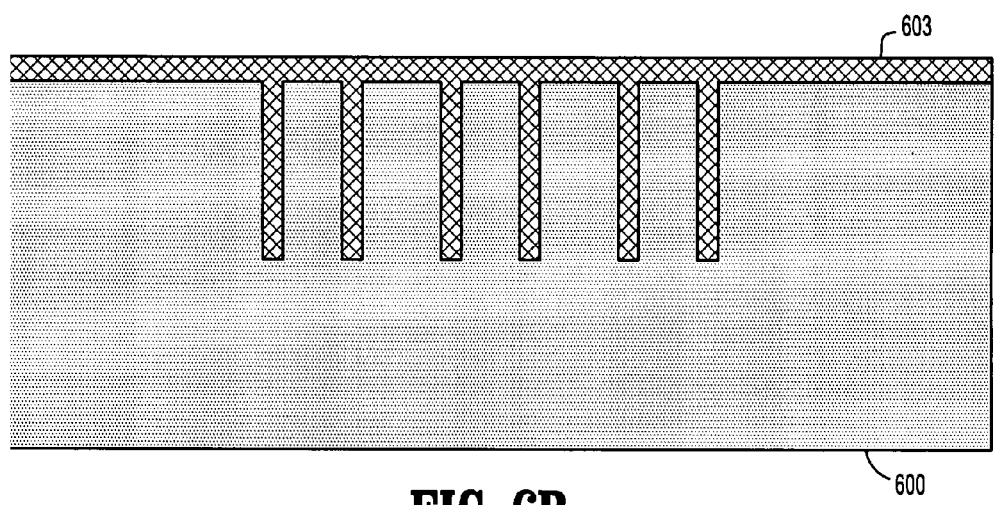

Following the etching of the annular trenches (601), a layer of insulating material (603) is formed to cover the surface of the wafer (600) and to backfill the annular trenches (601), such as depicted in FIG. 6B. The insulating layer (603) may be formed of materials and using methods as in the exemplary embodiments described above.

Figure 6C:
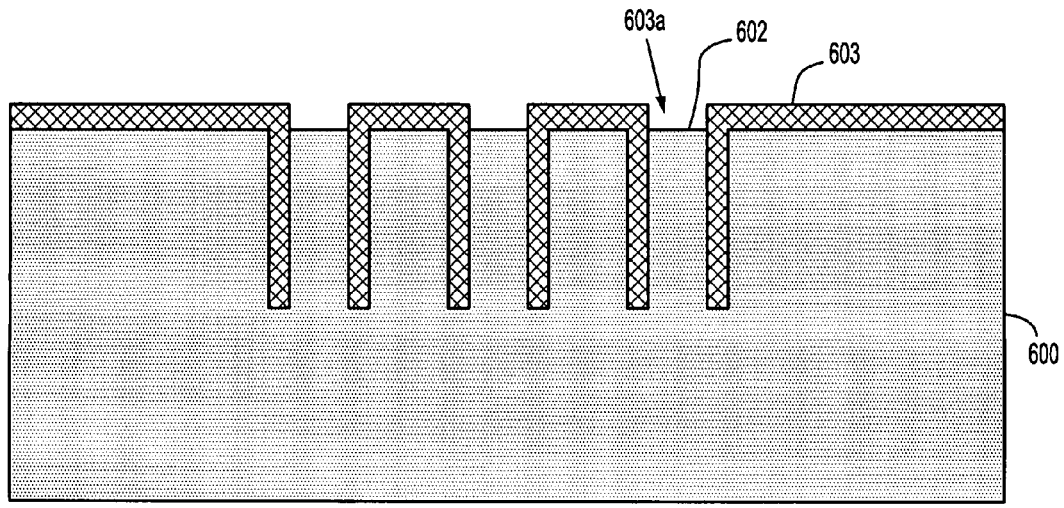
Figure 6D:
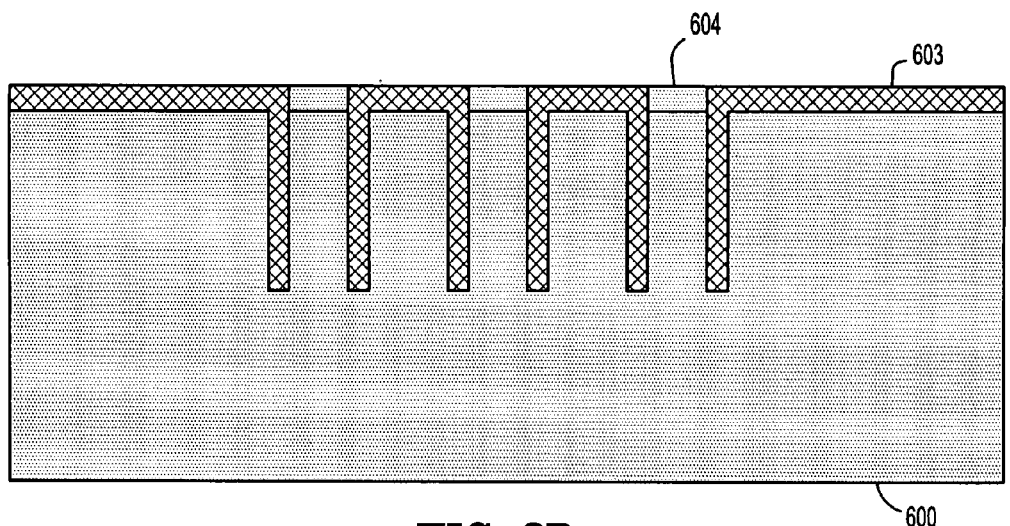
Figure 6E:
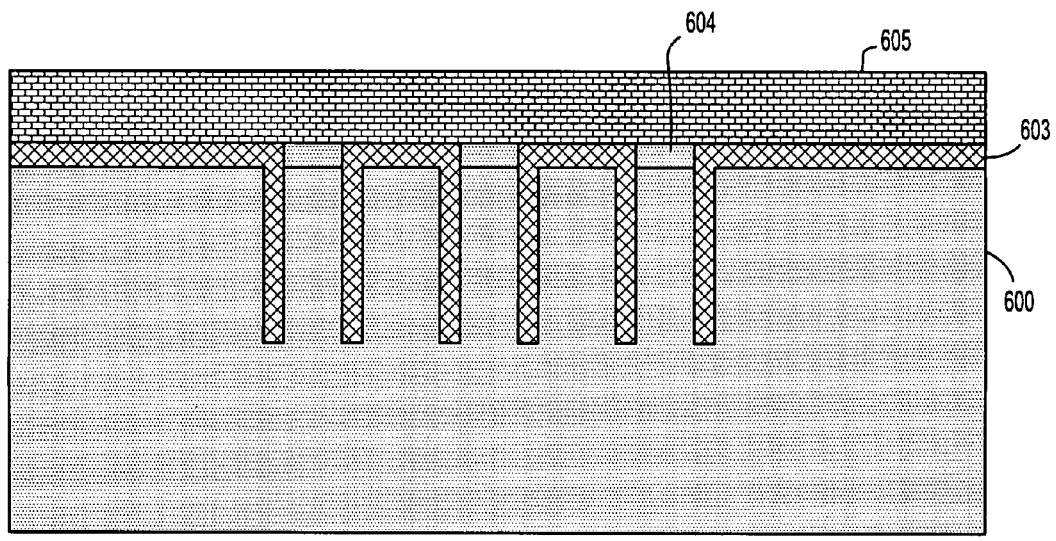

The insulating layer (603) is etched to form openings (603a) in the insulating layer (603) that are aligned to, and expose, the inner core features (602), as depicted in FIG. 6C. The openings (603a) are filled with metallic material (e.g., copper, tungsten) to form metal pads (604) (with an appropriate liner material), as shown in FIG. 6D. Thereafter, referring to FIG. 6E, a BEOL process may be performed to form interconnect structure (605) having wiring lines in contact with the metal pads (604)

Figure 6F:
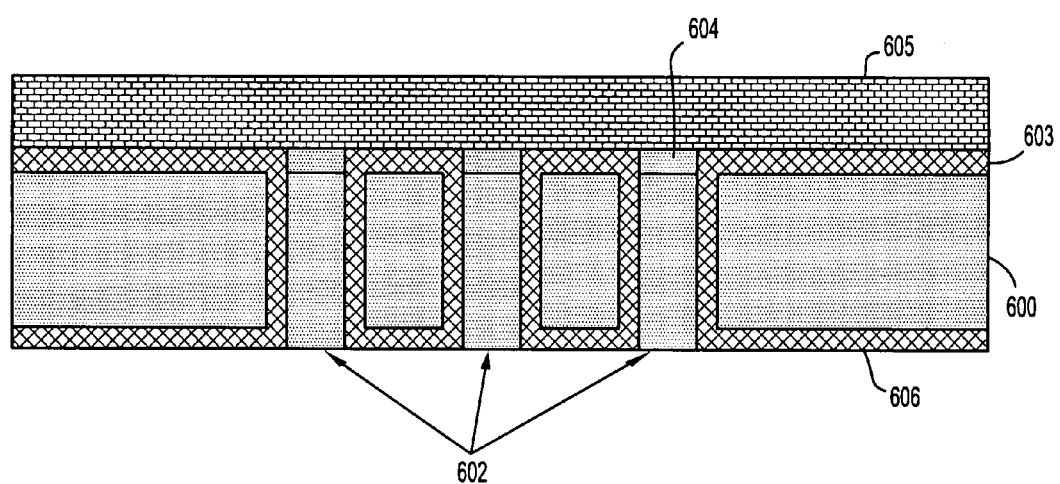

The wafer (600) is backside thinned using methods described above to remove the wafer material down to the bottom of the annular rings of insulating material, and an insulation layer (606) is formed on the thinned backside of the wafer (600), resulting in the structure depicted in FIG. 6F. Next, referring to FIG. 6G, the silicon core material (602) is removed to form via holes that expose the metallic pads (604). Thereafter, a liner (608) can be formed on the exposed surfaces of the via holes and then the via holes are filled with a conductive material (e.g., Cu or W) to form conductive inner cores (607). This metallization process can be performed via bottom-up copper fill plating process or CVD deposition of tungsten. If needed, a mechanical support carrier such as glass with adhesive can be attached to the top surface of the BEOL (605). If electrolytic copper plating is employed, a surface conductor can be added to the carrier so as to create an electrical path circuit to the metallic pads (604) on the bottoms of the vias by use of a conductor such as temporary blanket metal on the top surface of the BEOL structure (605) using techniques similar to that depicted in FIG. 4I, for example.

Figure 6G:
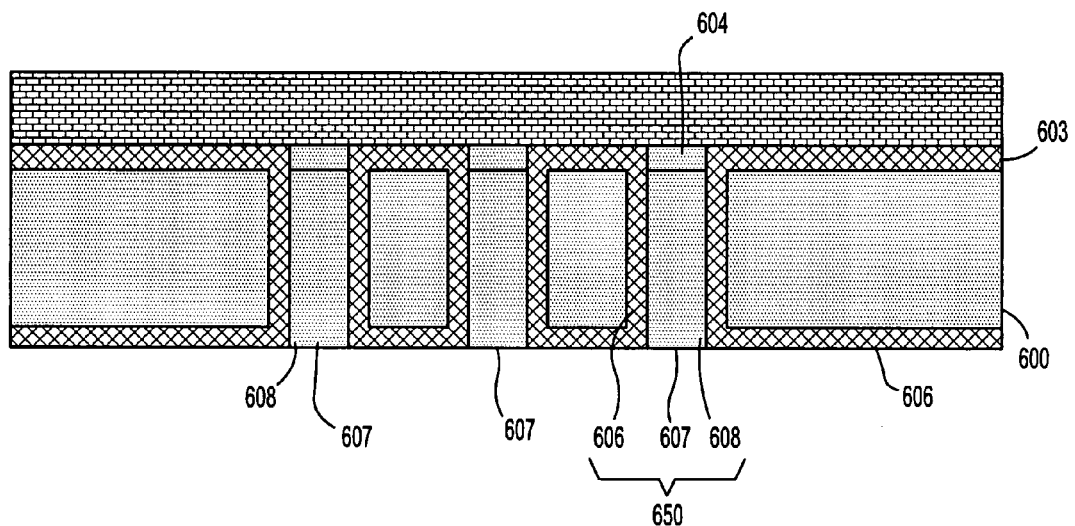
Figure 6H:
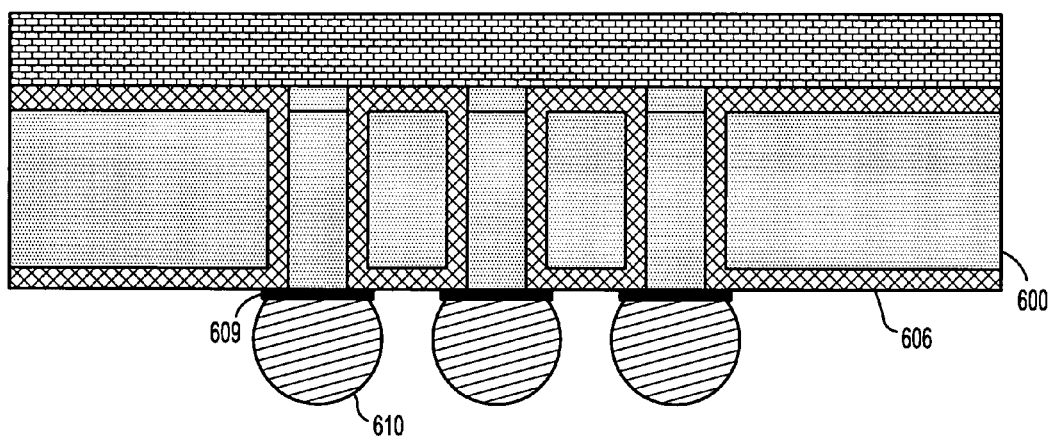

After the metallization process, the wafer surface can be polished via CMP if needed resulting in the structure of FIG. 6G comprising electrically isolated through-vias (650). Thereafter, metal pads (609) (e.g., Cr/Cu BLM) and C4s (610) solder balls (e.g., Pb/Sn solder) can be deposited over the exposed bottom surfaces of the vias (650), resulting in the silicon carrier structure depicted in FIG. 6H. The mechanical carrier can be removed by laser release of adhesive with appropriate cleaning or thermal release or IR release depending on the use of such mechanical handler.

The methods described above are illustrative of exemplary embodiments of the invention for constructing silicon carriers with high yield electrical through-via interconnects from blind via holes, through-via holes, or via holes having a metal contact. The exemplary methods discussed above can implement other fabrication steps such as FEOL processing for transistor fabrication, decoupling capacitors or any combination of active and passive integrated circuits, components together with wiring. The exemplary carrier structures with vias which contact metal features and which support desired vertical electrical integration can minimize space impact on active circuitry and can support increased wiring channels and/or passive density such as decoupling capacitors. The exemplary methods can support formation of robust mechanical carrier structures with through-vias, which can support wafer processing including processing to in excess of 400 degrees C. in wafer processing, support the conductor—dielectric mismatch of coefficients of thermal expansion between copper and silicon oxide, tungsten and silicon oxide (or similar conductor, insulations, liners and semiconductors, such as but not limited to copper, nickel, molybdenum, gold, etc. and silicon oxide, silicon nitride, etc., tantalum, tantium nitride, titanium, titanium nitride, silicon SiGe, GaAs, etc., while being able to process through silicon electrical structures at low cost.

Although exemplary embodiments have been described herein with reference to the accompanying drawings for purposes of illustration, it is to foe understood that the present invention is not limited to those precise embodiments, and that various other changes and modifications may be affected herein by one skilled in the art without departing from the scope of the invention.

We claim:

1. A method for fabricating a conductive via structure in a semiconductor substrate comprising:

forming a via hole in a semiconductor substrate, wherein the via hole comprises an open end on a first surface of the semiconductor substrate, an interior sidewall surface having an insulating layer formed thereon, and a closed end having a first conductive material providing a seed layer formed on a surface of the closed end of the via hole;

performing an electroplating process to fill the via hole with a second conductive material to form a conductive via using an electroplating process wherein plating current is forced to flow only through the surface of the closed end of the via hole so that plating starts from the seed layer on the surface of the closed end of the via hole and progresses towards the open end of the via hole; and forming electrical contacts to each end of the conductive via, wherein forming the via hole comprises:

forming a first insulating layer to cover the first surface of the substrate and sidewall and closed end surfaces of the via hole with first insulation material;

forming a conformal conductive liner over the first surface of the substrate to line the insulation layer and a second closed end surface of the via hole;

filling the via hole with a sacrificial material;

planarizing the first surface of the substrate down to the conformal conductive liner on the first surface of the substrate, the planarization forming a planarized surface;

forming a layer of second conductive material over the planarized surface;

bonding a carrier substrate to the second conductive material;

depositing a layer of third conductive material over the carrier substrate in electrical contact with the layer of second conductive material;

recessing the second surface of the semiconductor substrate down to the closed end of the via hole to open the via hole on the recessed second surface; and removing the sacrificial material in the via bole.

2. The method of claim 1, wherein forming the via hole comprises:

etching a closed end via hole in the first surface of the semiconductor substrate to a depth d below the first surface of the substrate, which is less than a thickness of the substrate defined by the first surface and a second surface of the substrate opposite the first surface.

3. The method of claim 2, wherein filling the via hole comprises:

performing the electroplating process by applying the plating current to the layer of third conductive material to fill the via hole with a copper material starting at a seed layer at a closed end of the via hole defined by a portion of the layer of second conductive material exposed by the via hole, wherein the first insulating layer impedes plating current from flowing from the carrier substrate through the semiconductor substrate and the sidewalls of the via hole in the substrate.

4. The method of claim 1, wherein the conductive via is a through-via structure that extends between the first surface and a second surface of the substrate opposite the first surface, wherein a width or diameter of the through-via structure is about 0.5 microns to about 10 microns and wherein a height of the through-via structure is less than about 10 microns.

5. The method of claim 1, wherein the conductive via is a through-via structure that extends between the first surface and a second surface of the substrate opposite the first surface, wherein a width or diameter of the through-via structure is about 0.5 microns to about 10 microns and wherein a height of the through-via structure is greater than about 300 microns.

6. The method of claim 1, wherein the conductive via is annular-shaped or rectangular shaped.

7. The method of claim 1, further comprising forming a conformal barrier layer to line inner surfaces of the via hole.

8. The method of claim 7, wherein the conformal barrier layer comprises TaN formed by PVD, CVD or ALD.

9. The method of claim 7, wherein the barrier layer and seed layer comprise a single layer of material serving as both a barrier and adhesion layer.

10. The method of claim 7, wherein the seed layer is formed of copper having a thickness of about 50 to about 300 angstroms, and wherein the barrier layer is formed of a layer of TaN having a thickness of about 10 to about 200 angstroms and a layer of Ta having thickness of about 10 angstroms to about 200 angstroms.

* * * * *